United States Patent
Sonehara et al.

(10) Patent No.: US 9,704,801 B1
(45) Date of Patent: Jul. 11, 2017

(54) SEMICONDUCTOR MEMORY DEVICE

(71) Applicant: Kabushiki Kaisha Toshiba, Minato-ku (JP)

(72) Inventors: Takeshi Sonehara, Yokkaichi (JP); Masaru Kito, Kuwana (JP); Toshiya Nakamori, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/268,140

(22) Filed: Sep. 16, 2016

Related U.S. Application Data

(60) Provisional application No. 62/296,269, filed on Feb. 17, 2016.

(51) Int. Cl.
| | |
|---|---|
| *H01L 29/792* | (2006.01) |
| *H01L 23/528* | (2006.01) |
| *H01L 27/1157* | (2017.01) |
| *H01L 27/11582* | (2017.01) |
| *H01L 23/522* | (2006.01) |
| *H01L 21/768* | (2006.01) |

(52) U.S. Cl.
CPC ...... *H01L 23/528* (2013.01); *H01L 21/76816* (2013.01); *H01L 21/76877* (2013.01); *H01L 23/5226* (2013.01); *H01L 27/1157* (2013.01); *H01L 27/11582* (2013.01)

(58) Field of Classification Search
CPC .......... H01L 27/1157; H01L 27/11582; H01L 23/528; H01L 23/5226; H01L 21/76816; H01L 21/76877
See application file for complete search history.

(56) References Cited

U.S. PATENT DOCUMENTS

| 8,779,499 B2 * | 7/2014 | Kiyotoshi ......... H01L 27/11524 |
| | | 257/319 |
| 8,921,918 B2 | 12/2014 | Shim et al. |
| 8,946,665 B2 | 2/2015 | Shim et al. |
| 2014/0073099 A1 | 3/2014 | Park et al. |
| 2015/0001460 A1 | 1/2015 | Kim et al. |

(Continued)

FOREIGN PATENT DOCUMENTS

| JP | 2012-94869 | 5/2012 |
| JP | 2014-22729 | 2/2014 |
| JP | 2015-142133 | 8/2015 |

*Primary Examiner* — Yosef Gebreyesus
(74) *Attorney, Agent, or Firm* — Oblon, McClelland, Maier & Neustadt, L.L.P.

(57) ABSTRACT

A semiconductor memory device includes first and second stacked bodies and a conductive body. The first and second stacked bodies are disposed side by side on the conductive layer. The conductive body is provided between the first and second stacked bodies. The first and second stacked bodies each includes a plurality of electrode layers stacked on the conductive layer, a first insulating layer between adjacent electrode layers, a second insulating layer including a first portion and a second portion, and a semiconductor layer extending through the plurality of electrode layers. The first portion is provided between the first insulating layer and one of the adjacent electrode layers. The second portion is separated from the first portion and provided on an end surface of the first insulating layer facing the conductive body. The second insulating layer has a dielectric constant higher than a dielectric constant of the first insulating layer.

15 Claims, 19 Drawing Sheets

(56) References Cited

U.S. PATENT DOCUMENTS

2015/0060992 A1    3/2015  Taekyung et al.
2015/0214242 A1    7/2015  Lee
2016/0343657 A1*  11/2016  Sawa ................ H01L 27/11582

* cited by examiner

SEMICONDUCTOR MEMORY DEVICE

CROSS-REFERENCE TO RELATED APPLICATIONS

This application is based upon and claims the benefit of priority from U.S. Provisional Patent Application 62/296,269 filed on Feb. 17, 2016; the entire contents of which are incorporated herein by reference.

FIELD

Embodiments are generally related to a semiconductor memory device.

BACKGROUND

A nonvolatile semiconductor memory device that includes three-dimensionally arranged memory cells is under developing. For example, a NAND semiconductor memory device includes a memory cell array including multiple electrode layers stacked on a substrate, a semiconductor channel extending through the multiple electrode layers, and a source contact body that is provided to be adjacent to the multiple electrode layers and electrically connects the substrate to a source line. To increase the density of the memory cells and enlarge the memory capacity in such a semiconductor memory device, it is necessary to increase the insulation breakdown voltage between the electrode layers and between the source contact and the electrode layers.

DETAILED DESCRIPTION

Figure 1:
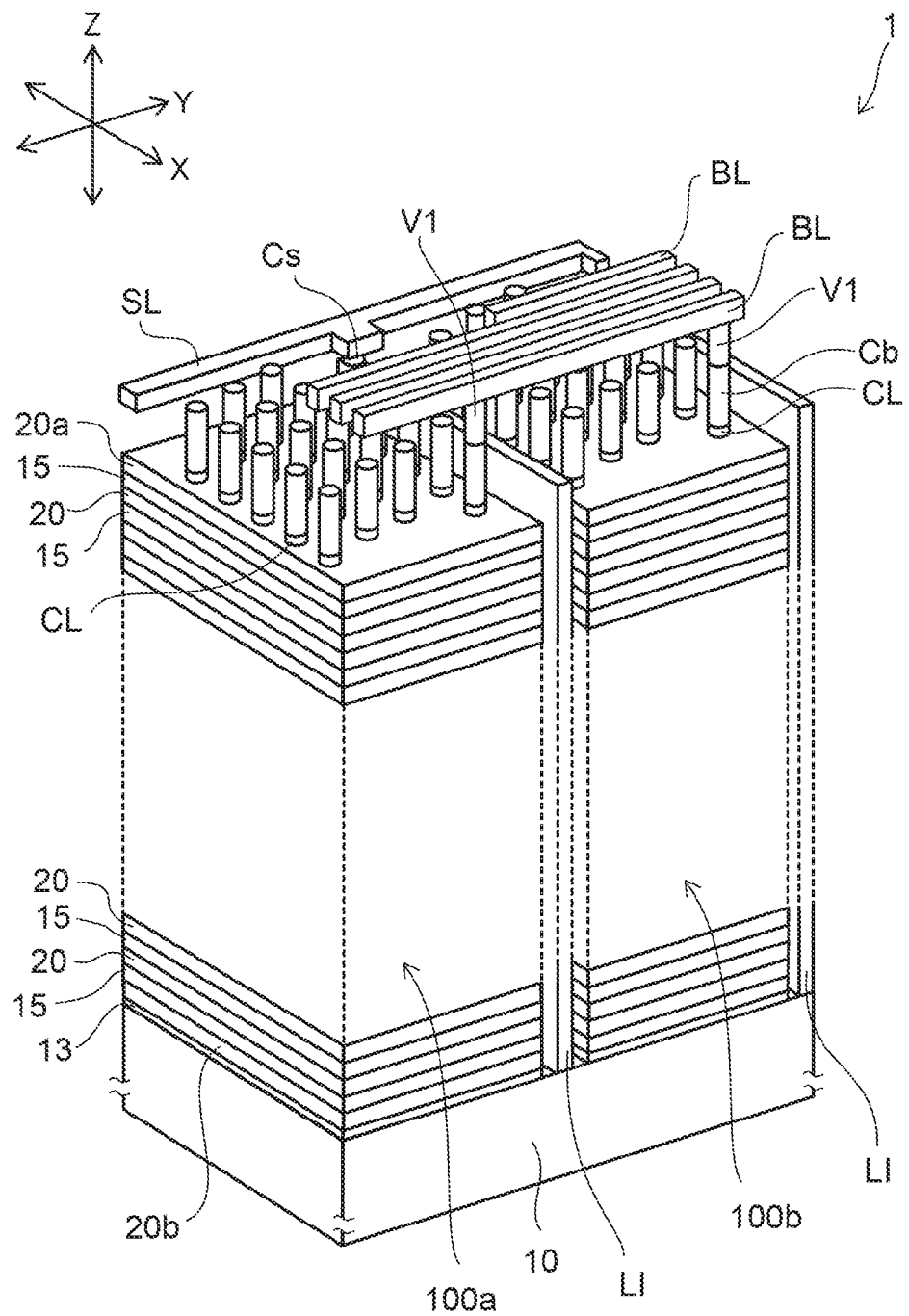
FIG. 1 is a perspective view schematically showing a semiconductor memory device according to a first embodiment.

According to an embodiment, a semiconductor memory device includes a first stacked body provided on a conductive layer, a second stacked body disposed side by side with the first stacked body on the conductive layer, and a conductive body provided between the first stacked body and the second stacked body and electrically connected to the conductive layer. The first stacked body and the second stacked body each includes a plurality of electrode layers stacked on the conductive layer, a first insulating layer provided between adjacent electrode layers of the plurality of electrode layers, a second insulating layer including a first portion and a second portion, a semiconductor layer extending through the plurality of electrode layers and the first insulating layer in a stacking direction of the plurality of electrode layers, and a charge storage part provided between the semiconductor layer and at least one electrode layer of the plurality of electrode layers. The first portion of the second insulating layer is provided between the first insulating layer and one of the adjacent electrode layers. The second portion of the second insulating layer is separated from the first portion and provided on an end surface of the first insulating layer facing the conductive body. The second insulating layer has a dielectric constant higher than a dielectric constant of the first insulating layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a perspective view schematically showing a semiconductor memory device 1 according to an embodiment. The semiconductor memory device 1 is a NAND type nonvolatile memory device, for example, and includes three-dimensionally arranged memory cells.

As shown in FIG. 1, the semiconductor memory device 1 includes a conductive layer (hereinbelow, taken to be a source layer 10), a stacked body 100a, and a stacked body 100b. The stacked bodies 100a and 100b are arranged in the Y-direction on the source layer 10. Each of the stacked bodies 100a and 100b include multiple electrode layers 20 and multiple insulating layers 15 stacked on the source layer 10 with an insulating layer 13 interposed. The electrode layers 20 and the insulating layers 15 are stacked alternately on the source layer 10. The insulating layers 15 electrically insulate the adjacent electrode layers 20 from each other in a first direction (hereinbelow, a Z-direction), which is the stacking direction of the electrode layers 20.

The source layer 10 is, for example, a P-type well provided in a silicon substrate (not shown). Also, the source layer 10 may be a polysilicon layer provided on the silicon substrate with an inter-layer insulating layer (not shown) interposed. The electrode layers 20 are metal layers, for example, including tungsten (W). The insulating layers 15 are, for example, silicon oxide layers.

Figure 2A:
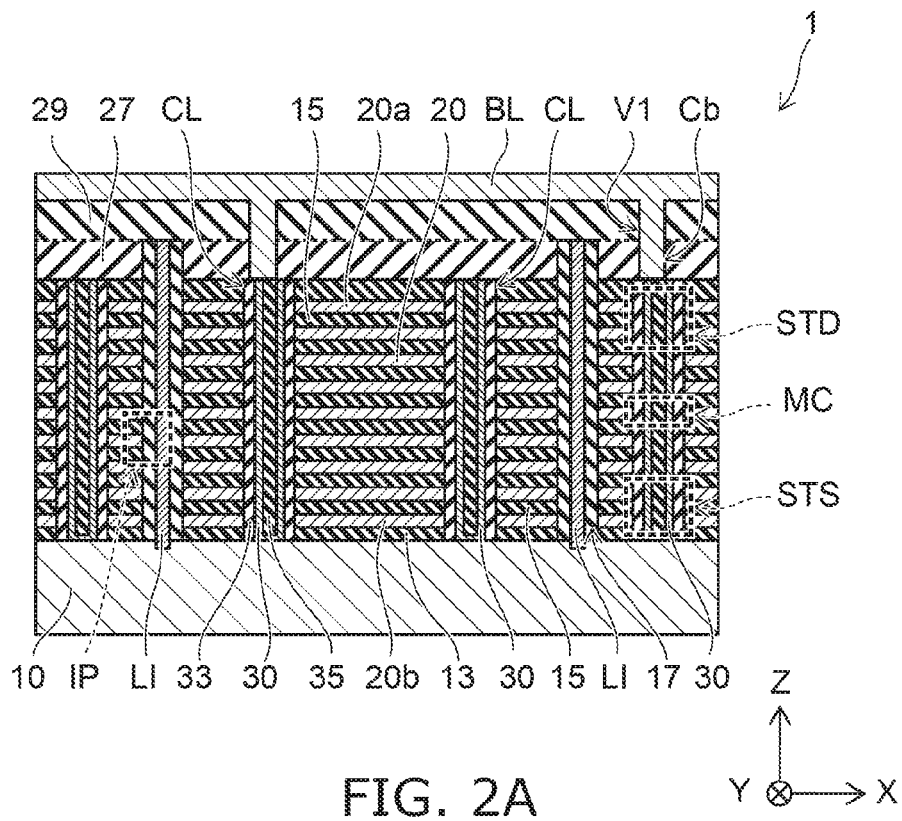
FIGS. 2A and 2B are schematic cross-sectional views showing the semiconductor memory device according to the first embodiment.

Each of the stacked bodies 100a and 100b includes multiple columnar bodies CL extending in the Z-direction and extending through the multiple electrode layers 20 and the multiple insulating layers 15 (referring to FIG. 2A). Each of the columnar bodies CL is electrically connected to a bit line BL via contact plugs Cb and V1. For example, the bit lines BL extend in the Y-direction above the stacked bodies 100a and 100b. One of the multiple columnar bodies CL provided in the stacked body 100a and one of the multiple columnar bodies CL provided in the stacked body 100b share one bit line BL. To illustrate the structure of the semiconductor memory device 1, insulating layers 27 and 29 (see FIG. 2A) are not shown in FIG. 1, which are provided between the bit lines BL and an electrode layer 20a that is the uppermost layer of the multiple electrode layers 20.

The semiconductor memory device 1 further includes a source line SL and a conductive body (hereinbelow, a source contact body LI) electrically connected to the source layer 10. The source contact body LI is provided between the stacked body 100a and the stacked body 100b. The source contact body LI is, for example, a metal body having a plate configuration extending in the X-direction and the Z-direction. Also, the source contact body LI is electrically connected to the source line SL via a contact plug Cs. In other words, the source line SL is electrically connected to the source layer 10 via the source contact body LI. For example, the source line SL extends in the Y-direction above the stacked bodies 100a and 100b.

Figure 2B:
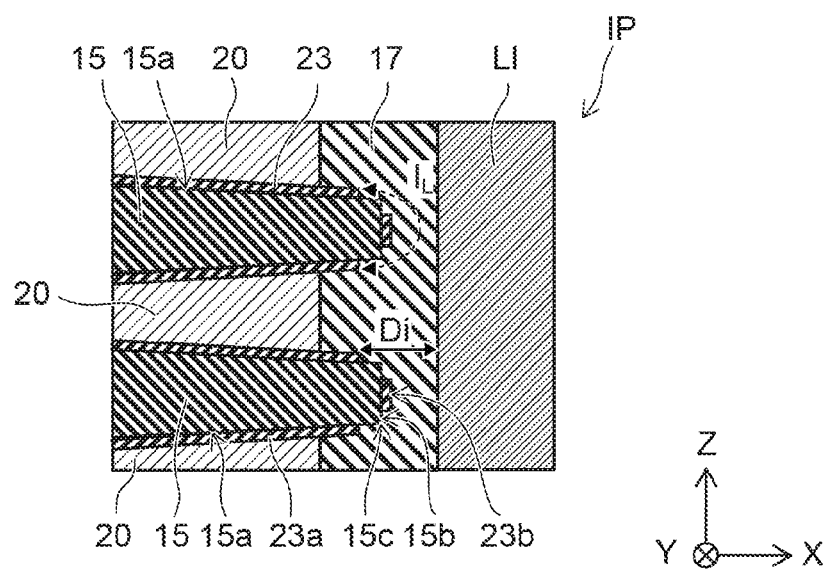

FIGS. 2A and 2B are schematic cross-sectional views showing the semiconductor memory device 1 according to the embodiment. FIG. 2A is a schematic view showing a part of the cross section along the Y-Z plane. FIG. 2B is a schematic cross-sectional view showing region IP illustrated by the broken line in FIG. 2A. Hereinbelow, the semiconductor memory device 1 will be described in detail with reference to FIGS. 2A and 2B.

As shown in FIG. 2A, the semiconductor memory device 1 includes the columnar bodies CL extending through the multiple electrode layers 20 and the multiple insulating layers 15 in the Z-direction. Each of the columnar bodies CL includes a semiconductor layer 30, an insulating layer 33, and a core 35. The semiconductor layer 30 extends in the Z-direction in the columnar body CL. The insulating layer 33 is positioned between the semiconductor layer 30 and each of the electrode layers 20 and extends in the Z-direction along the semiconductor layer 30. The semiconductor layer 30 is positioned between the insulating layer 33 and the core 35. The core 35 is an insulator embedded in the center of the columnar body CL.

For example, a source-side selection transistor STS, memory cells MC, and a drain-side selection transistor STD are provided at the portions where the columnar body CL extending through the multiple electrode layers 20. For example, the selection transistor STS is provided at the portions where the columnar body CL extends through an electrode layer 20b that is the lowermost layer and the electrode layer 20 adjacent thereto. For example, the selection transistor STD is provided at the portions where the columnar body CL extends through the electrode layer 20a that is the uppermost layer and the electrode layer 20 adjacent thereto. The memory cells MC are provided at the portions where the columnar body CL extends through the electrode layers 20 between the selection transistor STS and the selection transistor STD.

The semiconductor layer 30 acts as each channel of the memory cells MC and the selection transistors STS and STD. The electrode layers 20 that are positioned between the selection transistors STS and STD act as control gates of the memory cells MC. Also, a pair of the electrode layers 20a and the electrode layer 20 adjacent thereto and a pair of the electrode layer 20b and the electrode layers 20 adjacent to the electrode layers 20b act respectively as selection gates.

For example, the insulating layer 33 has an ONO structure in which silicon oxide, silicon nitride, and silicon oxide are stacked in order in the direction toward the semiconductor layer 30 from the electrode layers 20. The insulating layer 33 has portions functioning as charge storage parts of the memory cells MC, which are positioned between the semiconductor layer 30 and each of the electrode layers 20.

Thus, the semiconductor memory device 1 includes a NAND string including the selection transistors STS and STD and the multiple memory cells MC arranged along the columnar body CL extending in the Z-direction. For example, to increase the memory capacity of the semiconductor memory device 1, it is effective to increase the number of stacks of the electrode layers 20 and increase the density of the memory cells MC. However, in the case where the thicknesses in the Z-direction of the insulating layers 15 and the electrode layers 20 are set to be thin to increase the density of the memory cells MC, for example, there are cases where the insulation breakdown voltage decreases between the adjacent electrode layers 20. Also, in the case where the spacing between the stacked body 100a and the stacked body 100b is set to be narrower, there are cases where the insulation breakdown voltage decreases between the source contact body LI and the electrode layers 20.

FIG. 2B is a schematic cross-sectional view showing the end portion of the insulating layer 15 on the source contact body LI side. An insulating layer 17 is provided between the insulating layer 15 and the source contact body LI and between the electrode layer 20 and the source contact body LI. The insulating layer 17 is, for example, a silicon oxide layer. The insulating layer 17 electrically insulates the source contact body LI from the electrode layers 20.

As shown in FIG. 2B, the insulating layer 15 has a surface 15a that faces the electrode layer 20, and an end surface 15b that faces the source contact body LI. Further, an insulating layer 23 is provided to cover the insulating layer 15. The insulating layer 23 has a dielectric constant that is higher than the dielectric constant of the insulating layer 15. Also, it is desirable for the insulating layer 23 to include a material that is resistant to the etching conditions of a metal layer 50, which is used to form the electrode layer 20 (see FIGS. 4A and 4B). Further, it is favorable for the insulating layer 23 to include a material that can be removed using etching conditions to which the electrode layer 20 is resistant (see FIG. 4C). For example, it is desirable for the electrode layer 20 under the etching conditions of the insulating layer 23 to have an etching rate not more than ½ of the etching rate of the insulating layer 23.

The insulating layer 23 may include, for example, a so-called High-k material such as aluminum oxide ($Al_2O_3$), hafnium oxide ($HfO_x$), tantalum oxide ($TaO_x$), etc. Also, the insulating layer 23 may include, for example, at least one oxide of $Y_2O_3$, $La_2O_3$, $Gd_2O_3$, $Ce_2O_3$, $CeO_2$, $ZrO_2$, $TiO_2$, HfSiO, HfAlO, ZrSiO, ZrAlO, AlSiO, and the like. The insulating layer 23 may be an oxynitride, or an oxide or a nitride including at least one element of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Te, Ru, Rh, Pd, Ag, Cd, In, and Sn.

The insulating layer 23 is positioned between the electrode layer 20 and the columnar body CL and is provided to suppress the movement of the carrier between the charge storage part and the control gate of the memory cell MC. In the formation process of the insulating layer 23 described below, the insulating layer 23 is formed to cover the side surface of the columnar body CL and is formed as a high dielectric constant layer covering the insulating layer 15. Also, the insulation resistance of such a high dielectric constant layer is small, for example, compared to the insulation resistance of a low dielectric constant layer such as a silicon oxide layer, etc. Therefore, in the case where the layer thickness of the insulating layer 15 is reduced, a leakage current $I_L$ flowing through the insulating layer 23 increases; and the insulation breakdown voltage is lowered between the adjacent electrode layers 20.

In the embodiment, the insulating layer 23 includes, for example, a first portion 23a positioned between the electrode layer 20 and a surface 15a of the insulating layer 15, and a second portion 23b provided on the end surface 15b of the insulating layer 15. The second portion 23b is provided to be separated from the first portion 23a at a corner 15c where the surface 15a and the end surface 15b of the insulating layer 15 contact. The insulating layer 15 that is exposed between the first portion 23a and the second portion 23b is covered with the insulating layer 17. In other words, the insulating layer 17 separates the second portion 23b from the first portion 23a. Thereby, the leakage path via the insulating layer 23 is broken between the electrode layers 20 adjacent to each other in the Z-direction; and the leakage current $I_L$ can be suppressed.

Also, as shown in FIG. 2B, a spacing Di between the source contact body LI and the end of the first portion 23a of the insulating layer 23 is wider than the spacing between the second portion 23b and the source contact body LI. Thereby, the insulation breakdown voltage becomes higher between the source contact body LI and the electrode layers 20.

Thus, in the embodiment, it is possible to set the insulation breakdown voltage between the adjacent electrode layers 20 and between the source contact body LI and the electrode layers 20 to be higher by separating the first portion 23a of the insulating layer 23 from the second portion 23b. Thereby, it is possible to improve the reliability of the data programming and the data erasure to and from the memory cell MC, for which the high voltage is applied between the electrode layer 20 and the source contact body LI; and higher density may be achieved in the three-dimensional arrangement of the memory cells MC.

A method for manufacturing the semiconductor memory device 1 will now be described with reference to FIGS. 3A to 3H. FIGS. 3A to 3H are schematic cross-sectional views showing the manufacturing processes of the semiconductor memory device 1 according to the embodiment.

Figure 3A:
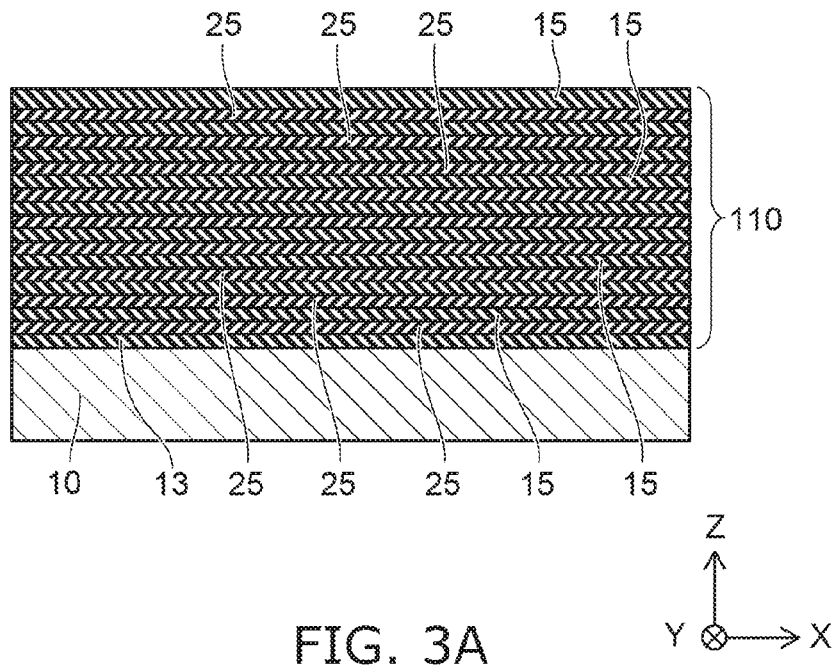
FIGS. 3A to 3H are schematic cross-sectional views showing a manufacturing process of the semiconductor memory device according to the first embodiment.

As shown in FIG. 3A, a stacked body 110 is formed on the source layer 10 by alternately stacking the insulating layers and insulating layers 25 with the insulating layer 13 interposed. The insulating layers 13 and 15 are, for example, silicon oxide layers. The insulating layers 25 are, for example, silicon nitride layers. For example, the insulating layers 13, 15, and 25 are formed using CVD (Chemical Vapor Deposition).

Figure 3B:
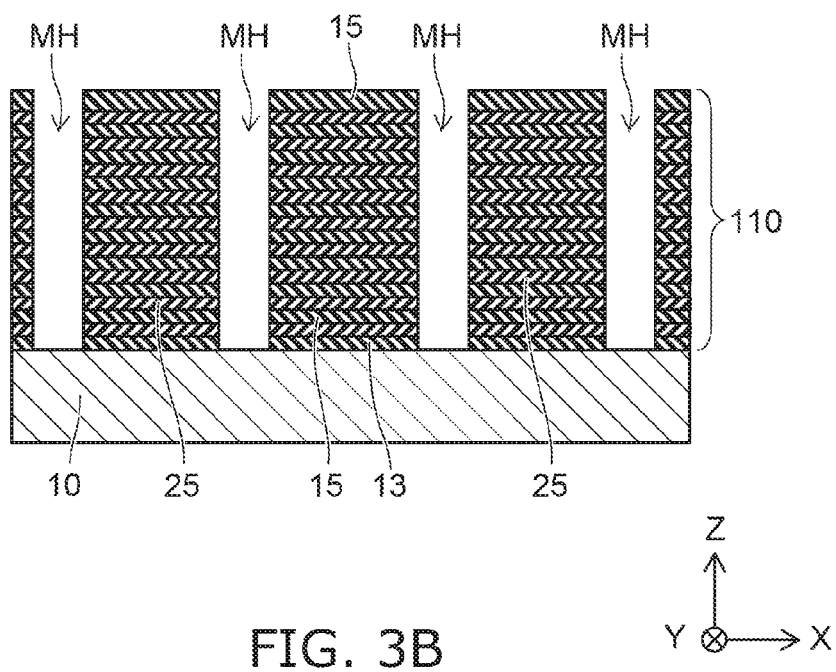

Memory holes MH are made as shown in FIG. 3B, which have depths enough to reach the source layer 10 from the upper surface of the stacked body 110. For example, the memory holes MH are made by selectively removing the insulating layers 13, 15, and 25 using anisotropic RIE. The source layer 10 is exposed at the bottom surfaces of the memory holes MH.

Figure 3C:
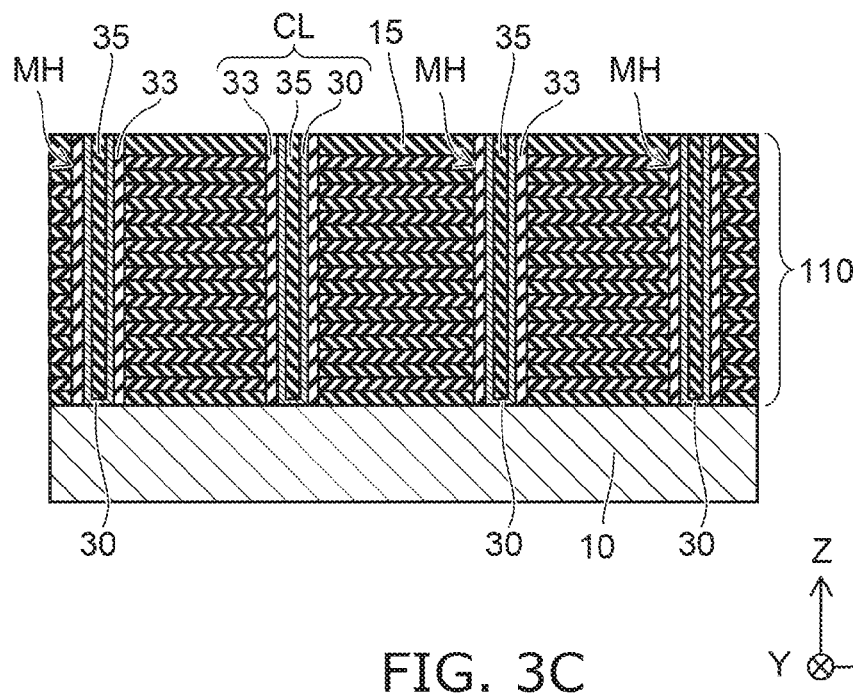

As shown in FIG. 3C, the columnar bodies CL are formed in the interiors of the memory holes MH. For example, the insulating layer 33, the semiconductor layer 30, and the core 35 are formed in order on the inner walls of the memory holes MH. For example, the insulating layer 33 is formed using CVD and has an ONO structure in which a silicon oxide layer, a silicon nitride layer, and a silicon oxide layer are stacked in order on the inner walls of the memory holes MH. The semiconductor layer 30 is, for example, a polysilicon layer formed using CVD and covers the insulating layer 33 and the source layer 10 that is exposed as the bottom surfaces of the memory holes MH. The core 35 is, for example, silicon oxide formed using CVD and is embedded in the memory holes MH.

Figure 3D:
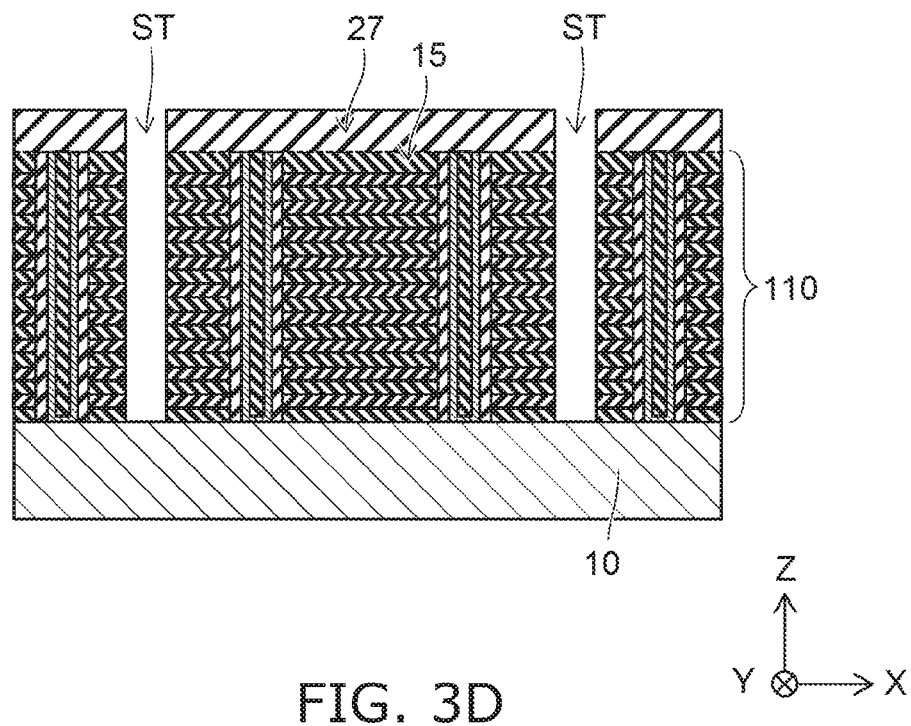

As shown in FIG. 3D, the insulating layer 27 is formed to cover the upper surface of the stacked body 110. The insulating layer 27 is, for example, a silicon oxide layer formed using CVD. Then, slits ST are made to have depths enough to reach the source layer 10 from the upper surface of the insulating layer 27. For example, the slits ST are made using anisotropic RIE and extend in the Y-direction. The slits ST divide the stacked body 110 into multiple portions each including multiple columnar bodies CL.

Figure 3E:
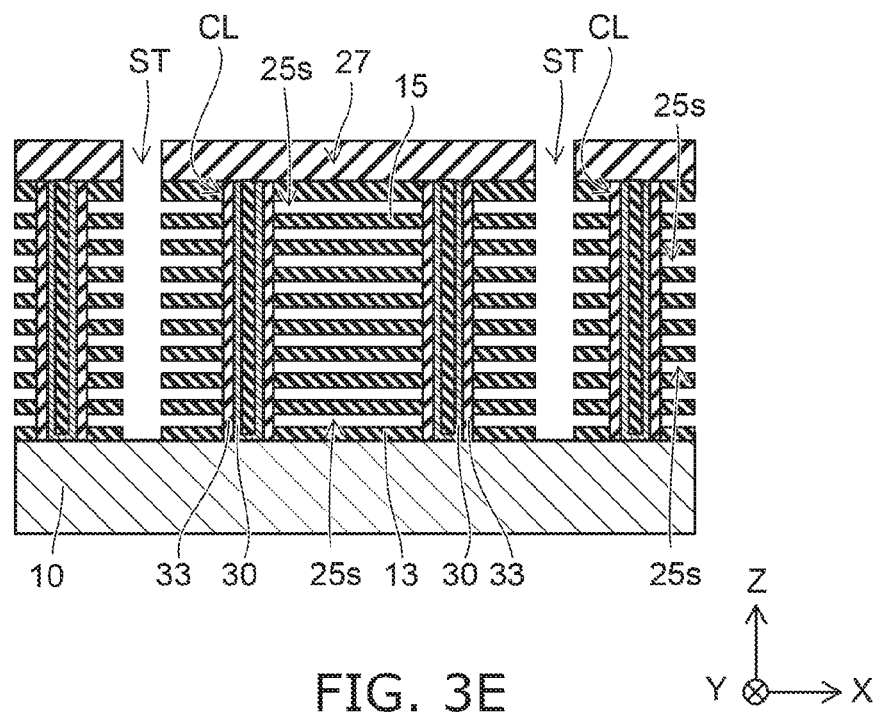

As shown in FIG. 3E, the insulating layers 25 are selectively removed by supplying an etchant via the slits ST. For example, in the case where the insulating layers 13, 15, and 27 are silicon oxide layers and the insulating layers 25 are silicon nitride layers, the insulating layers 25 can be selectively removed by supplying hot phosphoric acid as the etchant. In this process, the insulating layer 33 of the columnar body CL is resistant to the etchant.

Figure 3F:
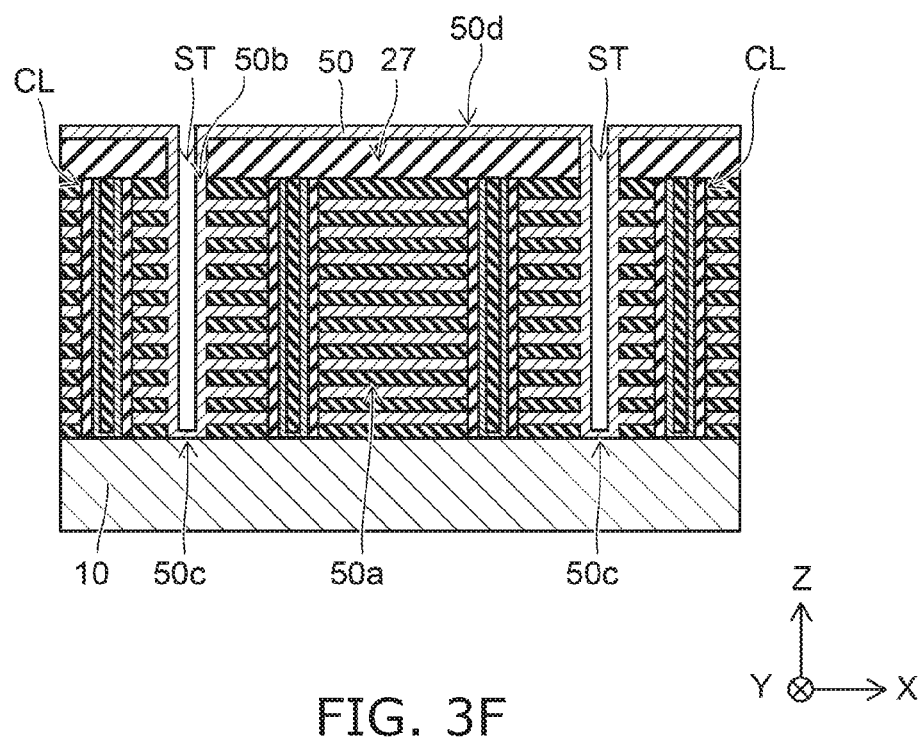

As shown in FIG. 3F, the insulating layer 23 and the metal layer 50 are formed to fill the spaces 25s (see FIG. 3E) where the insulating layers 25 are removed. While not shown in FIG. 3F, the insulating layer 23 is formed between the metal layer 50 and the insulating layers 15 and between the metal layer 50 and the columnar bodies CL.

For example, the insulating layer 23 is formed using ALD (Atomic Layer Deposition), which covers the inner walls of the slits ST and the inner surfaces of the spaces 25s where the insulating layers 25 are removed. Then, the metal layer 50 is deposited in the spaces 25s using CVD, for example. The metal layer 50 includes, for example, a barrier metal 51 and a high-melting-point metal 53 such as tungsten, etc. (see FIG. 4A). The barrier metal 51 is, for example, titanium nitride (TiN) and is formed between the insulating layer 23 and the high-melting-point metal 53.

Figure 3G:
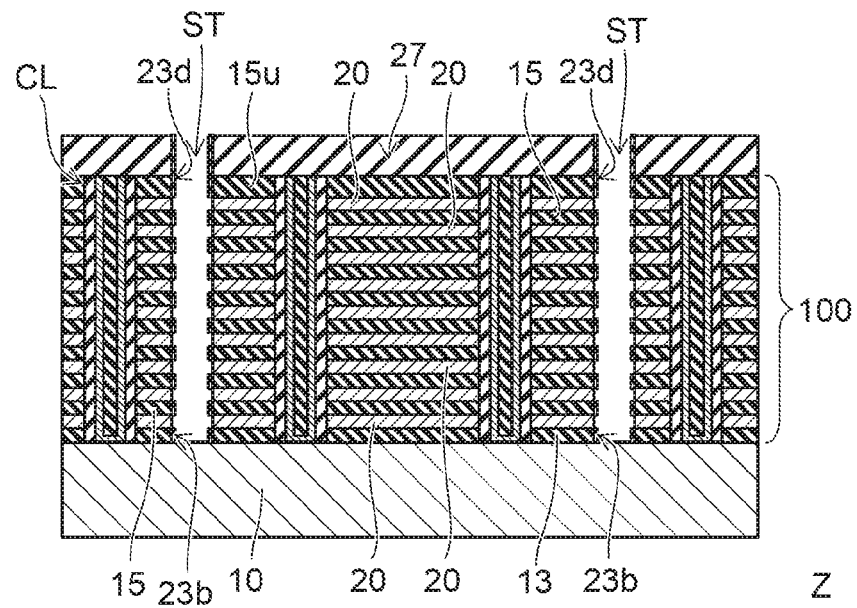

As shown in FIG. 3G, the electrode layers 20 are formed in the spaces 25s. In other words, removing metal layers 50b and 50c that cover the inner surfaces of the slits ST and a metal layer 50d that covers the upper surface of the insulating layer 27 is implemented, leaving a metal layer 50a in the spaces 25s (see FIG. 3F). This process will be described in detail in reference to FIGS. 4A to 4D. Thereby, a stacked body 100 is formed, which includes the multiple electrode layers 20 stacked on the source layer 10. In the description hereinbelow, the stacked body 100 is described without distinguishing between the stacked bodies 100a and 100b.

The second portion 23b of the insulating layer 23 remains on the end surface of each of the insulating layer 13 and the insulating layers 15. Further, an insulating layer 23d, which is the third portion of the insulating layer 23, remains on the end surface of each of the insulating layer 27 and an insulating layer 15u that is the uppermost layer of the multiple insulating layers 15.

Figure 3H:
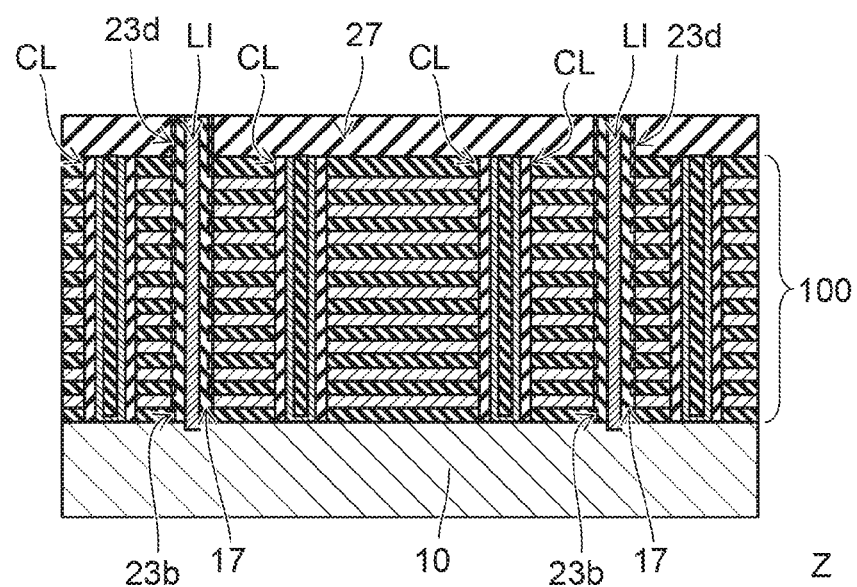

As shown in FIG. 3H, the insulating layer 17 is formed to cover the inner walls of the slits ST; and then, the source contact body LI is formed in each of the slits ST. The insulating layer 17 is, for example, a silicon oxide layer formed using CVD. For example, the source contact body LI is formed using CVD and has a structure in which a barrier metal and a high-melting-point metal such as tungsten, etc., are stacked.

The source line SL (not-shown) is formed on the insulating layer 27 and electrically connected to the source contact body LI via the contact plug Cs (see FIG. 1). Further, the insulating layer 29 is formed to cover the insulating layer 27 and the source contact body LI; and the bit lines BL are formed on the insulating layer 29 (see FIG. 2A).

The process of removing the metal layer 50 shown in FIG. 3F will now be described with reference to FIGS. 4A to 4D. FIGS. 4A to 4D are schematic cross-sectional views showing a portion corresponding to region IP in FIG. 2A.

Figure 4A:
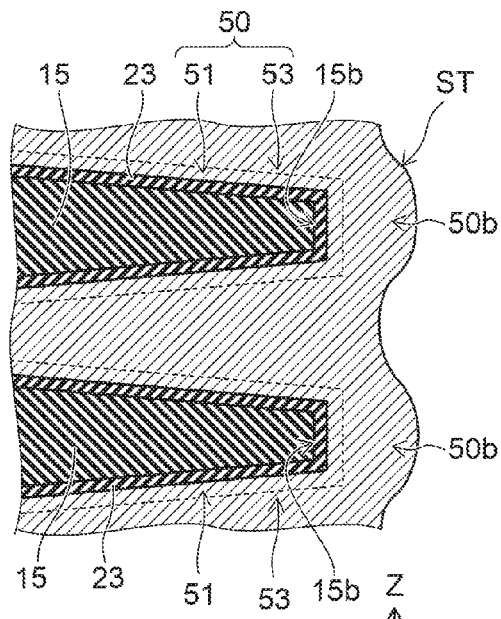
FIGS. 4A to 4D are schematic views showing a part of the manufacturing process according to the first embodiment.

As shown in FIG. 4A, the metal layer 50 is formed between the insulating layers 15 adjacent to each other in the Z-direction and on the end surface 15b of the insulating layer 15 on the source contact body LI side. The insulating layer 23 that is deposited first is positioned between the insulating layer 15 and the metal layer 50. For example, the metal layer 50 has a structure in which the barrier metal 51 and the high-melting-point metal 53 are stacked. The barrier metal 51 is positioned between the insulating layer 23 and the high-melting-point metal 53. The metal layer 50b that is formed on the wall surface of the slit ST (see FIG. 3F) has, for example, an uneven surface in which the portion formed on the end surface 15b of the insulating layer 15 protrudes.

Figure 4B:
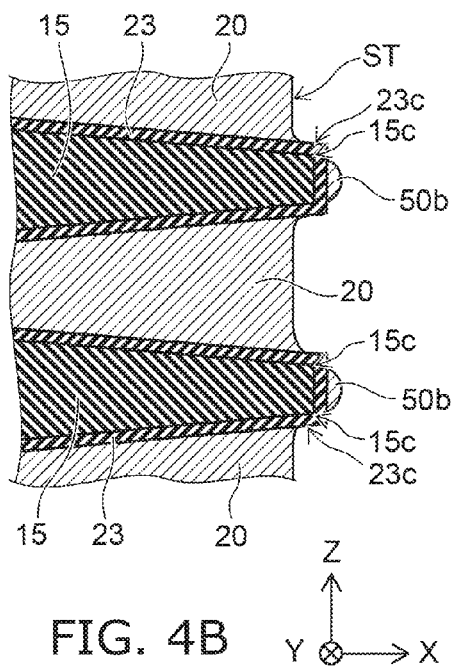

As shown in FIG. 4B, the surface of the slit ST recedes by etching the metal layer 50b. For example, the metal layer 50b is etched isotropically by supplying an etchant via the slit ST. Thereby, the electrode layers 20 are formed by separating the metal layers 50a deposited above and below the insulating layers 15 from each other (see FIG. 3F). The etching of the metal layer 50b is not limited to wet etching; and dry etching may be used for selectively removing the metal layer 50b with respect to the insulating layer 23.

Figure 4C:
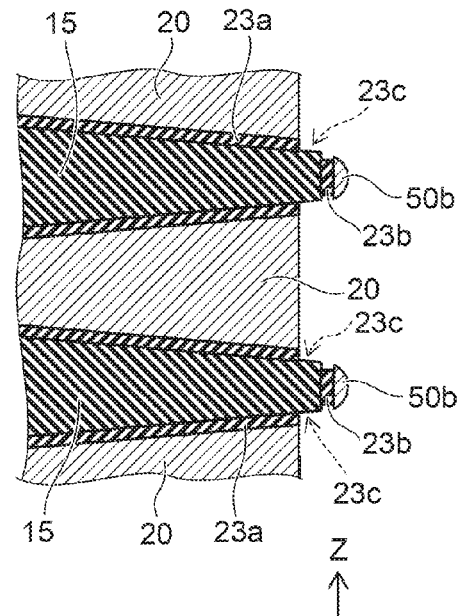

In the example, the etching is stopped at the point in time when the metal layers 50a deposited above and below the insulating layers 15 are separated from each other. At this time, a part of the metal layer 50b remains on the end surface 15b of the insulating layer 15; and the portion 23c of the insulating layer 23 is exposed, which is deposited on the corner 15c of the insulating layer 15 on the source contact body LI side Then, the portion 23c of the insulating layer 23 is selectively removed as shown in FIG. 4C. For example, the portion 23c of the insulating layer 23 is removed using dry etching. Thereby, the first portion 23a and the second portion 23b of the insulating layer 23 are formed such that the second portion 23b is separated from the first portion 23a.

Figure 4D:
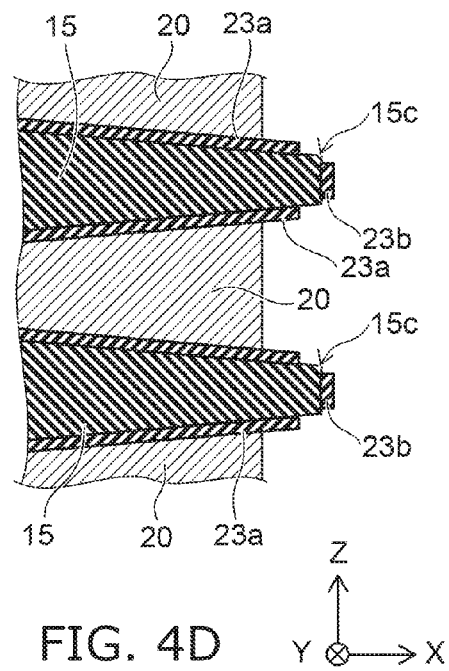

Further, the metal layer 50b that remains on the insulating layer 23 is removed as shown in FIG. 4D. For example, the metal layer 50b is removed by wet etching. Subsequently, the insulating layer 17, the source contact body LI, etc., are formed by the process described with reference to FIG. 3H; and the semiconductor memory device 1 shown in FIGS. 2A and 2B is completed.

Second Embodiment

Figure 5:
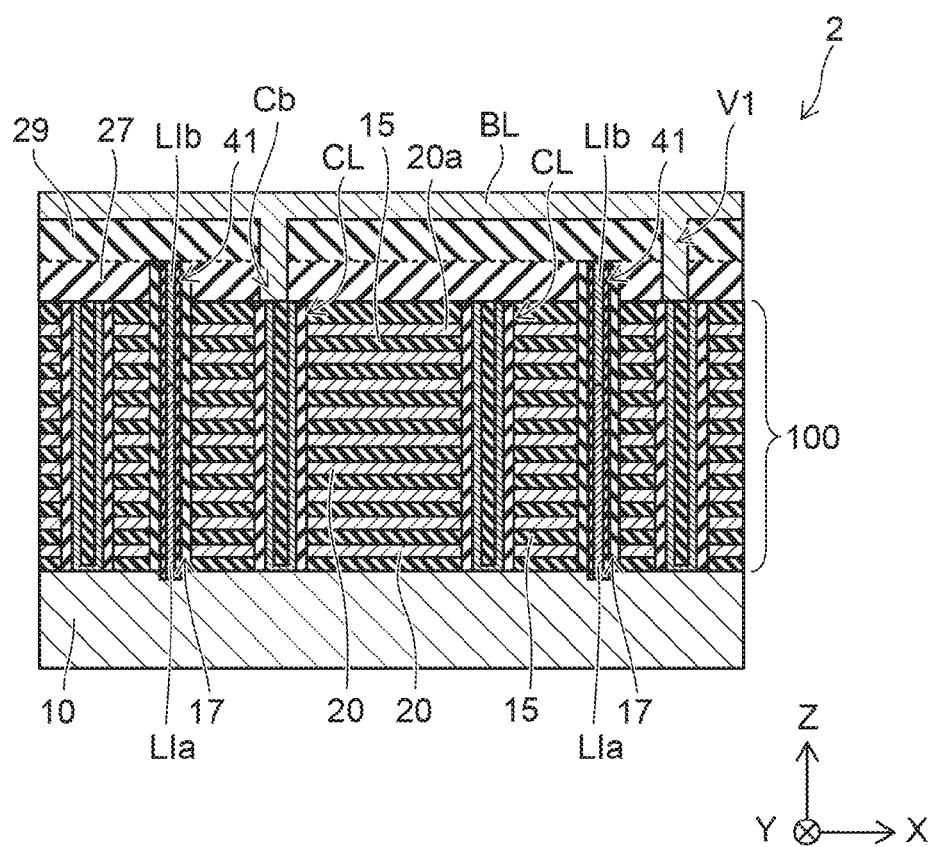
FIG. 5 is a schematic cross-sectional view showing a semiconductor memory device according to a second embodiment.

A semiconductor memory device 2 shown in FIG. 5 includes the source contact body LI including a first portion LIa and a second portion LIb. The first portion LIa is positioned between the source layer 10 and the second portion LIb and is electrically connected to the source layer 10. The first portion LIa includes, for example, polysilicon; and the second portion LIb includes a metal.

For example, the size of the source contact body LI becomes longer in the Z-direction when the aspect ratio of the stacked body 100 is enlarged by increasing the number of stacks of the electrode layers 20. Therefore, the stress inside the memory cell array becomes large due to the difference between the thermal expansion coefficients of the stacked body 100 and the source contact body LI in the case where the entire source contact body LI is a metal. Thereby, for example, the warp of the wafer on which the semiconductor memory device is formed may become large; and the manufacturing yield may be reduced.

On the other hand, in the case where the entire source contact is polysilicon, the electrical resistance in the Y-direction of the source contact body LI becomes large. Then, different biases are supplied to semiconductor layers 30 respectively via the source layer 10 due to the voltage drop in the Y-direction of the source contact bodies LI. Therefore, there is a risk that the voltage applied between the semiconductor layer 30 and the electrode layers 20 which are the control gates of the memory cells MC may be different in every NAND string and induce malfunctions in the memory cells MC.

Accordingly, it is favorable to suppress the warp of the wafer by using polysilicon in the first portion LIa of the source contact body LI. Further, it is favorable to suppress the increase of the electrical resistance in the entire source contact body LI by using the second portion LIb of metal.

Figure 6A:
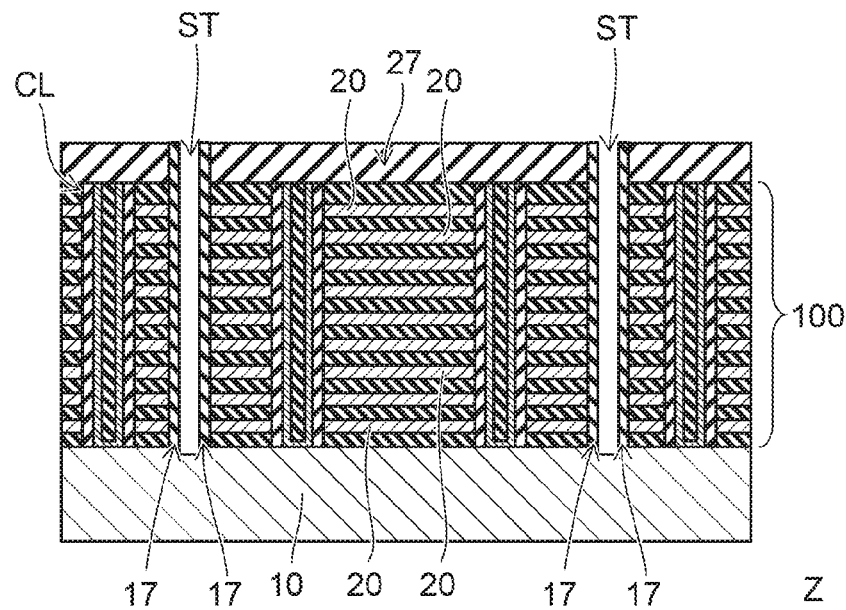
FIGS. 6A to 6F are schematic cross-sectional views showing a manufacturing process of the semiconductor memory device according to the second embodiment.

In the embodiment, an insulating layer 41 is provided between the second portion LIb and the insulating layer 17 covering the inner wall of the slit ST (see FIG. 6A). The insulating layer 41 includes, for example, a material having an etching rate slower than those of the insulating layer 17 and the insulating layer 27 under the etching conditions of polysilicon.

A method for manufacturing the semiconductor memory device 2 will now be described with reference to FIGS. 6A to 6F. FIGS. 6A to 6F are schematic cross-sectional views showing the manufacturing processes of the semiconductor memory device 2. For example, FIG. 6A follows FIG. 3G, and shows the manufacturing process. In such a case, the second portion 23b and the third portion 23d of the insulating layer 23 may remain on the insulating layer 15 and the insulating layer 27, or may be removed in the process of the etching of the metal layer 50.

As shown in FIG. 6A, the insulating layer 17 is formed on the inner walls of the slits ST. The insulating layer 17 is, for example, a silicon oxide layer. For example, a silicon oxide layer that covers the inner surfaces of the slits ST and the upper surface of the insulating layer 27 is formed using CVD. Then, for example, the silicon oxide layer that is deposited on the bottom surfaces of the slits ST is selectively removed using anisotropic RIE (Reactive Ion Etching). Thereby, the insulating layer 17 that covers the inner walls of the slits ST is formed; and the source layer 10 can be exposed at the bottom surfaces of the slits ST. The silicon oxide layer that is deposited on the upper surface of the insulating layer 27 is removed in this process.

Figure 6B:
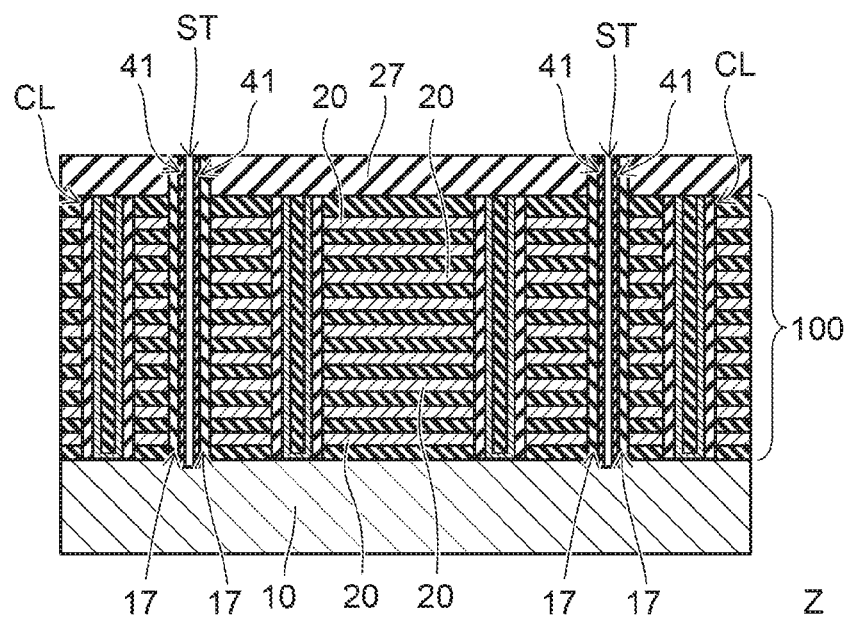

As shown in FIG. 6B, the insulating layer 41 is formed on the inner walls of the slits ST. The insulating layer 41 covers the insulating layer 17 in the slits ST. For example, the insulating layer 41 is formed to cover the inner surfaces of the slits ST and the upper surface of the insulating layer 27 using CVD. Then, the portions of the insulating layer 41 covering the bottom surfaces of the slits ST and the upper surface of the insulating layer 27 are removed, for example, using anisotropic RIE, leaving the portions thereof on the inner walls of the slits ST.

The insulating layer 41 may include, for example, a High-k material such as aluminum oxide ($Al_2O_3$), hafnium oxide ($HfO_x$), tantalum oxide ($TaO_x$), etc. Also, the insulating layer 41 may include, for example, at least one oxide of $Y_2O_3$, $La_2O_3$, $Gd_2O_3$, $Ce_2O_3$, $CeO_2$, $ZrO_2$, $TiO_2$, HfSiO, HfAlO, ZrSiO, ZrAlO, AlSiO, and the like. The insulating layer 41 may be an oxynitride, or an oxide or a nitride including at least one element of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Te, Ru, Rh, Pd, Ag, Cd, In, or Sn.

Figure 6C:
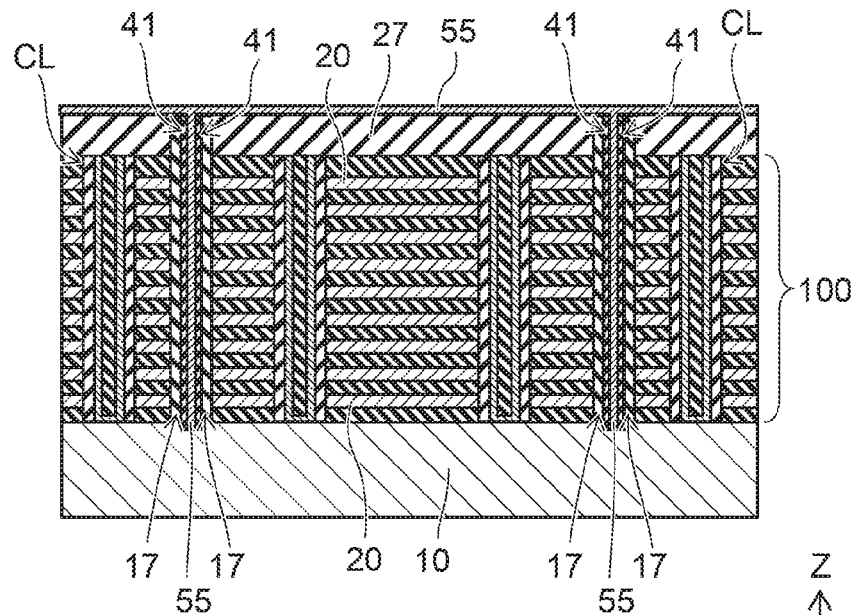

As shown in FIG. 6C, a conductive layer 55 that fills the interiors of the slits ST and covers the upper surface of the insulating layer 27 is formed. The conductive layer 55 is, for example, a polysilicon layer and is formed using CVD.

Figure 6D:
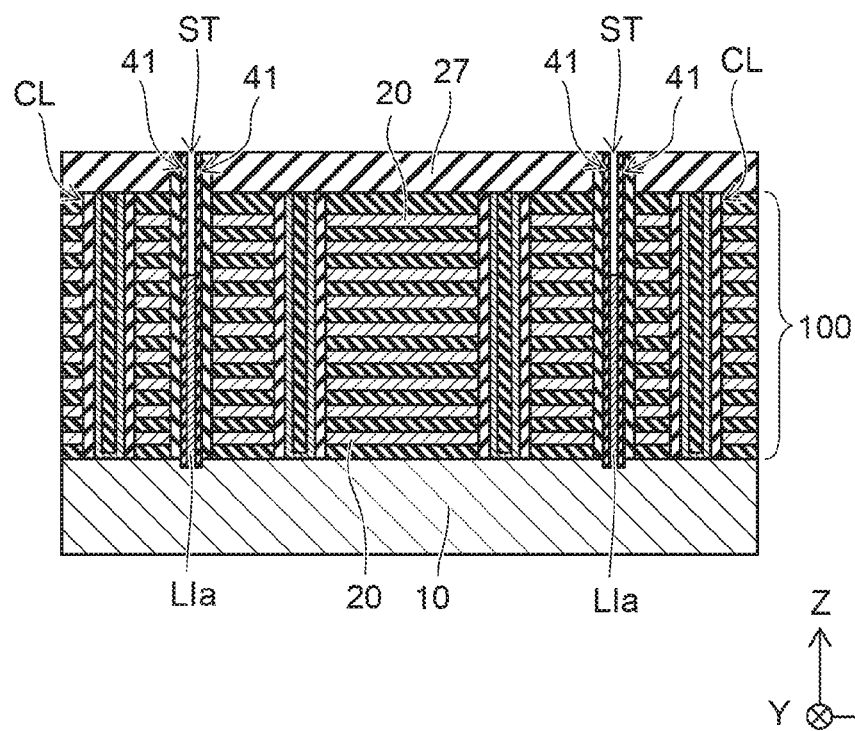

As shown in FIG. 6D, the first portion LIa of the source contact body LI is formed in the slit ST by implementing etch-back of the conductive layer 55. The conductive layer 55 that is deposited on the upper surface of the insulating layer 27 and in the upper portion of the slit ST is removed using, for example, anisotropic RIE. In this process, the insulating layer 41 suppresses the etching of the insulating layers 25 in the upper portion of the slit ST and restricts the spreading in the X-direction and the reverse direction (the −X direction) of the slit ST.

Figure 6E:
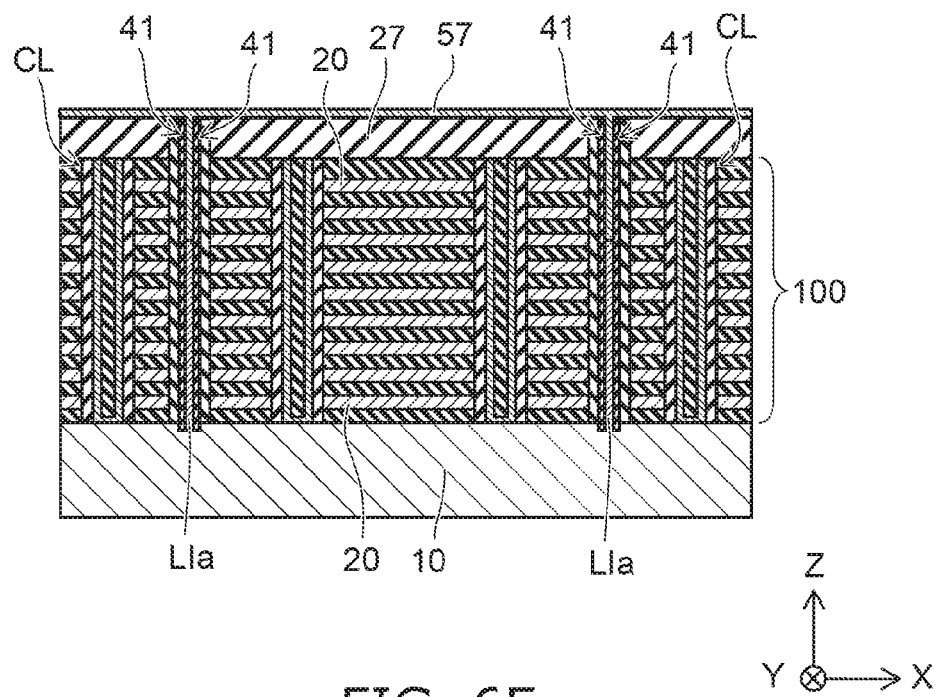

As shown in FIG. 6E, a conductive layer 57 is formed to fill the interior of the slit ST higher than the first portion LIa of the source contact body LI and to cover the upper surface of the insulating layer 27. For example, the conductive layer 57 has a structure in which barrier metal (TiN) and high-melting-point metal such as tungsten, etc., are stacked in order. For example, the conductive layer 57 is formed using CVD.

Figure 6F:
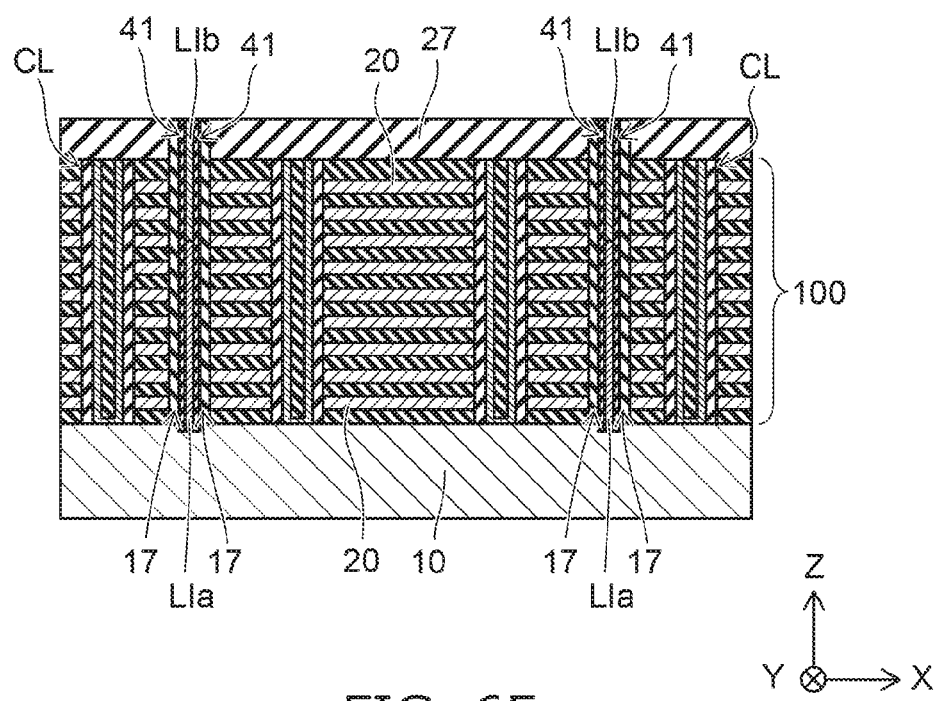

As shown in FIG. 6F, etch-back of the conductive layer 57 is implemented to remove the portion formed on the insulating layer 27. Thereby, the second portion LIb of the source contact body LI is formed in the upper portion of the slit ST. The second portion LIb is electrically connected to the first portion LIa. Then, the insulating layer 29 and the bit lines BL are formed after forming the source line SL on the insulating layer 27; and the semiconductor memory device 2 is completed (referring to FIG. 1 and FIG. 5).

Figure 7A:
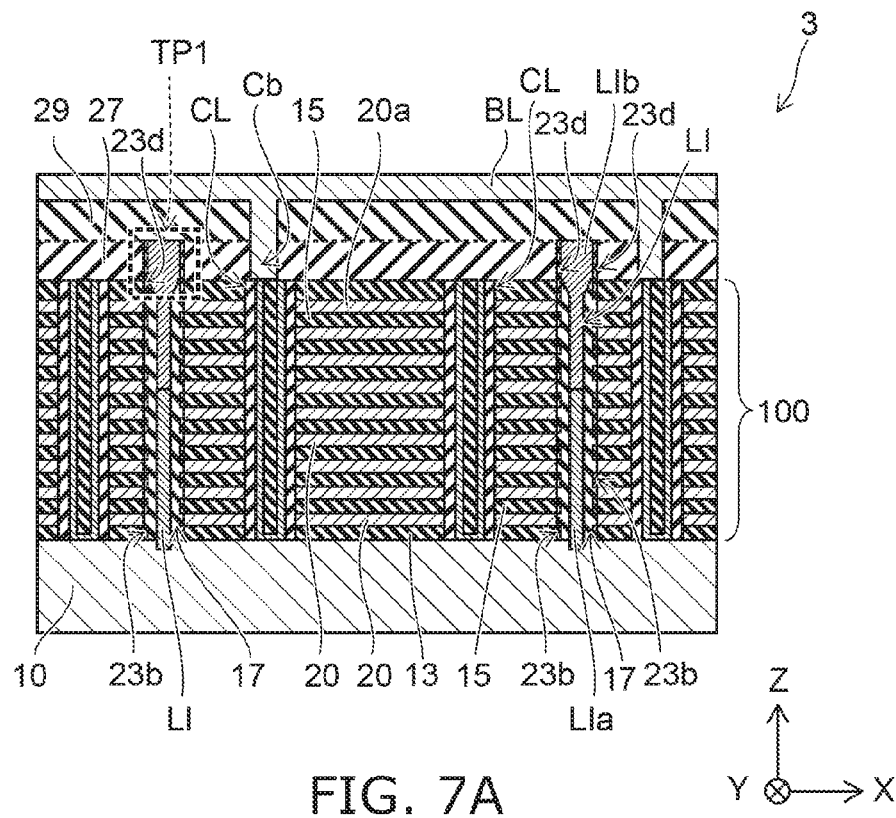
FIGS. 7A and 7B are schematic cross-sectional views showing a semiconductor memory device according to a variation of the second embodiment.
Figure 7B:
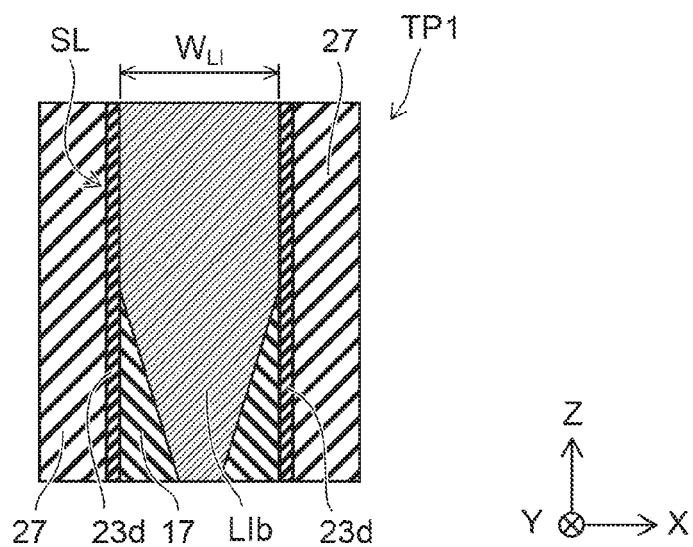

FIGS. 7A and 7B are schematic cross-sectional views showing a semiconductor memory device 3 according to a variation of the second embodiment. FIG. 7B is a schematic cross-sectional view showing region TP1 shown in FIG. 7A.

As shown in FIG. 7A, the semiconductor memory device 3 includes the source contact body LI including the first portion LIa and the second portion LIb. The first portion LIa is positioned between the source layer 10 and the second portion LIb and is electrically connected to the source layer 10. The first portion LIa includes, for example, polysilicon; and the second portion LIb includes a metal. In the example, the second portion 23b of the insulating layer 23 is provided on the end surface of each of the insulating layers 13 and 15. Also, the third portion 23d of the insulating layer 23 is provided on the end surface of the insulating layer 27.

FIG. 7B schematically shows the structure of the upper end of the second portion LIb. The upper end of the second portion LIb is formed to divide the insulating layer 27. The insulating layer 23d is provided between the second portion LIb and the insulating layer 27. For example, under the etching conditions of polysilicon, the insulating layer 23d has etching resistance that is higher than those of the insulating layers 17 and 27. Therefore, the spreading in the X-direction of the upper end of the second portion LIb of the source contact body LI can be suppressed. For example, a width $W_{L1}$ in the X-direction of the upper end of the source contact body LI can be maintained to be narrower than the spacing of the stacked bodies 100 adjacent to each other in the X-direction (i.e., the spacing of the electrode layers 20 adjacent to each other in the X-direction).

A method for manufacturing the semiconductor memory device 3 will now be described with reference to FIGS. 8A to 8D. For example, FIG. 8A follows FIG. 3G and shows the manufacturing process.

Figure 8A:
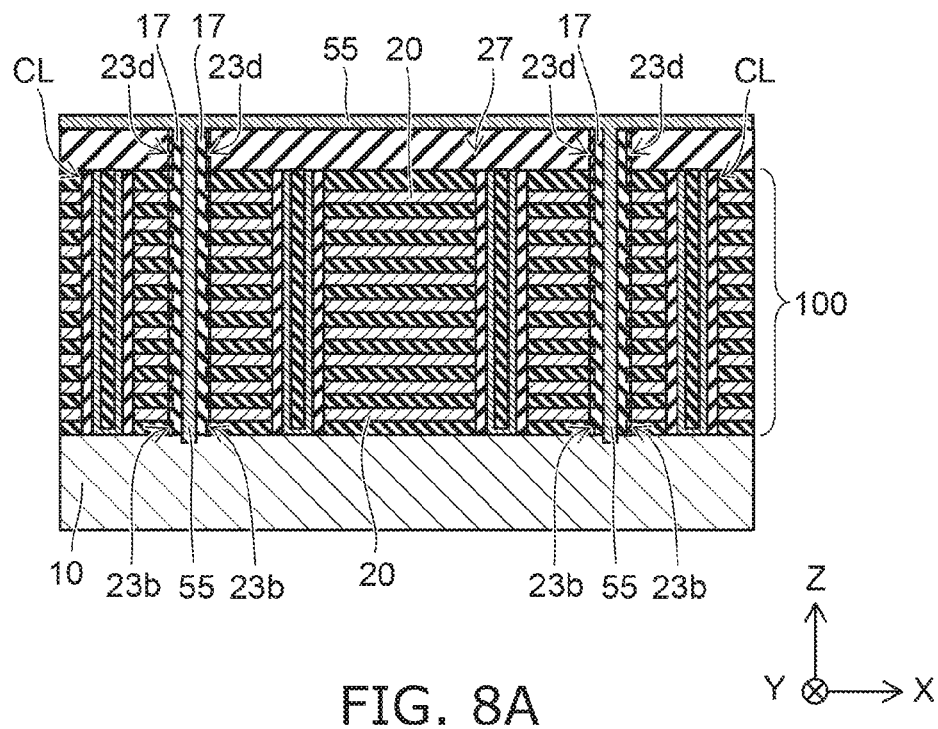
FIGS. 8A and 8B are schematic cross-sectional views showing a manufacturing process of the semiconductor memory device according to the variation of the second embodiment.

As shown in FIG. 8A, the conductive layer 55 that fills the interiors of the slits ST and covers the upper surface of the insulating layer 27 is formed after forming the insulating layer 17 that covers the inner walls of the slits ST. The conductive layer 55 is, for example, a polysilicon layer and is formed using CVD.

Figure 8B:
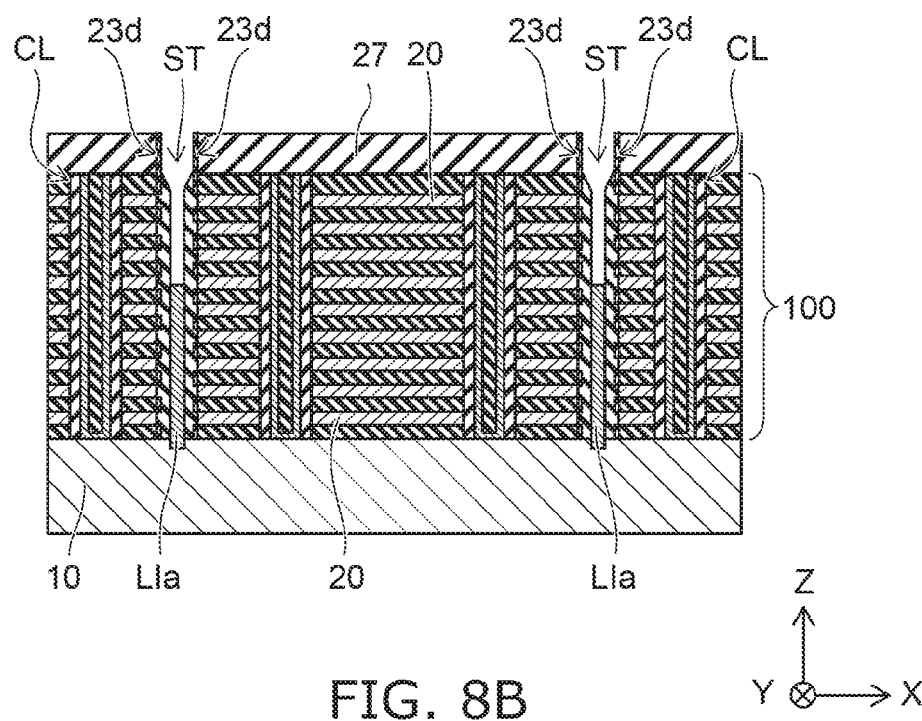

As shown in FIG. 8B, etch-back of the conductive layer is implemented to remove the portion filling the upper portion of the slit ST. Thereby, the first portion LIa of the source contact body LI is formed in the lower portion of the slit ST. The conductive layer 55 that is deposited on the upper surface of the insulating layer 27 and in the upper portion of the slit ST is removed using, for example, anisotropic RIE. In this process, the insulating layer 17 is etched so that the upper end of the slit ST spreads in the X-direction and in the reverse direction (the −X direction). However, the etching may be suppressed by the insulating layer 23d; and the spreading of the upper end of the slit ST may be limited in the X-direction and the −X direction.

Then, the second portion LIb of the source contact body LI is formed in the slit ST after the processes shown in FIGS. 6E and 6F. Further, the source line SL, the insulating layers 27 and 29, and the bit lines BL are formed on the insulating layer 27; and the semiconductor memory device 3 is completed (see FIG. 7A).

Figure 9:
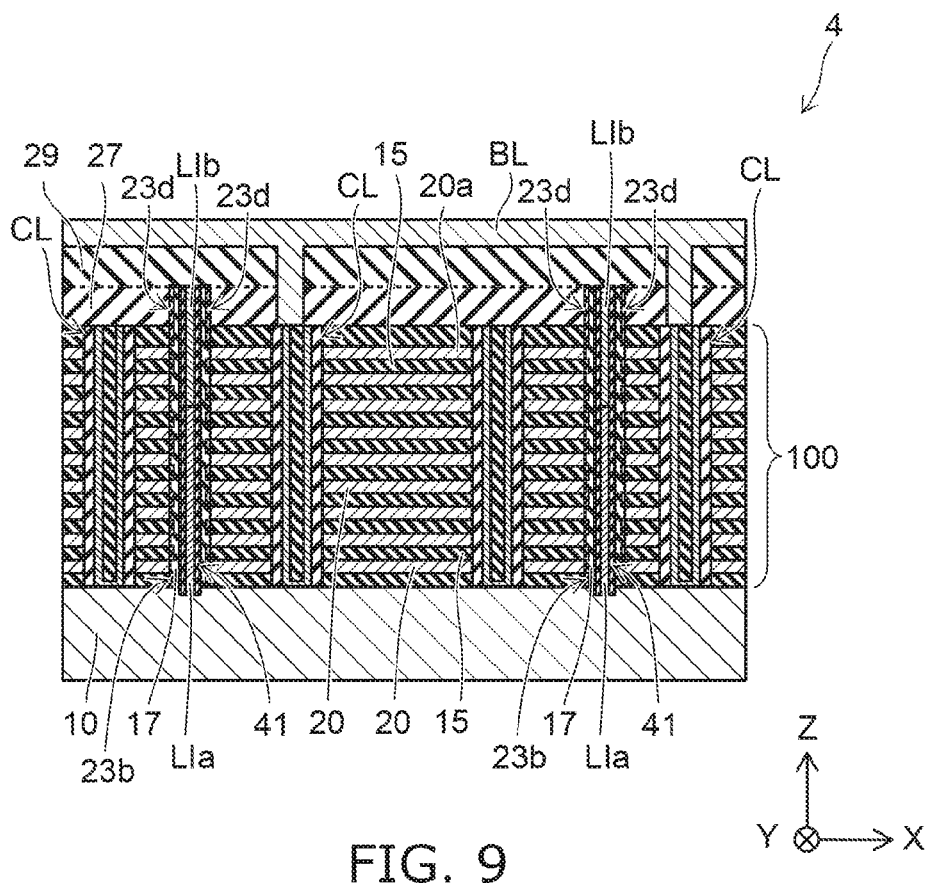
FIG. 9 is a schematic cross-sectional view showing a semiconductor memory device according to another variation of the second embodiment.

FIG. 9 is a schematic cross-sectional view showing a semiconductor memory device 4 according to another variation of the second embodiment. As shown in FIG. 9, the semiconductor memory device 4 includes the insulating layer 41, the second portion 23b and the third portion 23d of the insulating layer 23, and the source contact body LI including the first portion LIa and the second portion LIb. The insulating layer 17 is provided between the insulating layer 41 and the second portion 23b of the insulating layer 23 and between the insulating layer 41 and the third portion 23d of the insulating layer 23.

In the example, the insulating layer 41 and the third portion 23d of the insulating layer 23 suppress the spreading in the X-direction and the −X direction of the upper end of the slit ST in the process of forming the first portion LIa of the source contact body LI in the lower portion of the slit ST by implementing etch-back of the conductive layer 55 (FIG. 6B).

Thus, in the embodiment, the spreading in the X-direction and the −X direction of the upper end of the slit ST may be suppressed by providing the insulating layer 41 and the third portion 23d of the insulating layer 23 in the upper portion of the slit ST. Thereby, for example, the decrease of the insulation breakdown voltage may be avoided between the second portion LIb of the source contact body LI and the electrode layer 20a which is the uppermost layer of the multiple electrode layers 20 and between the second portion LIb and the contact plug Cb of the bit line BL electrically connected to the memory cell MC of the columnar body CL (one end of the NAND string).

Third Embodiment

Figure 10A:
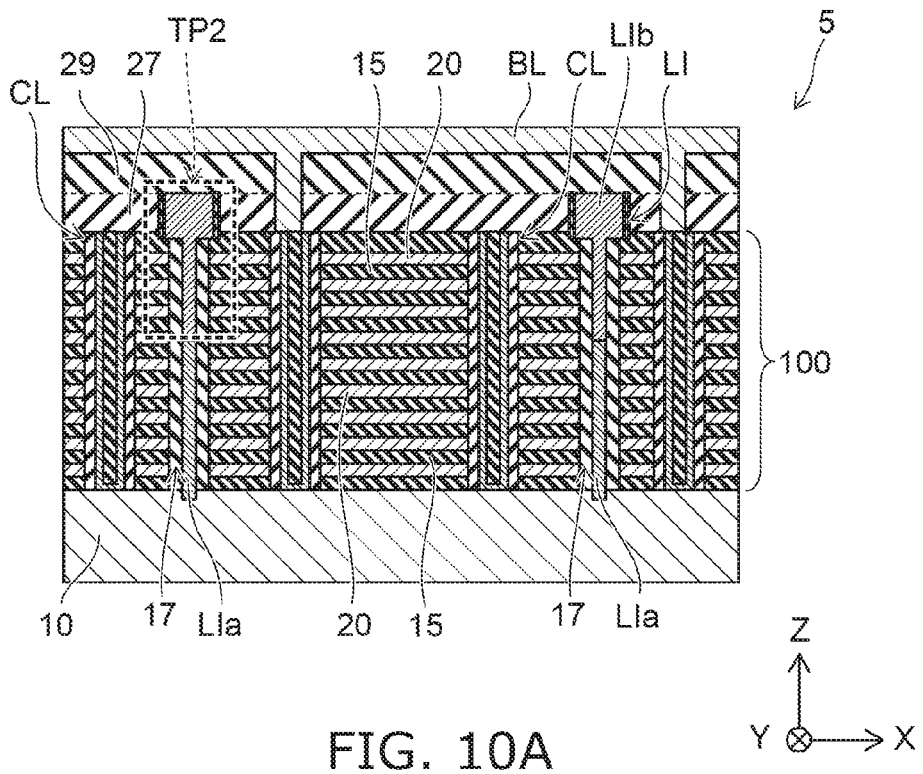
FIGS. 10A and 10B are schematic views showing a semiconductor memory device according to a third embodiment.
Figure 10B:
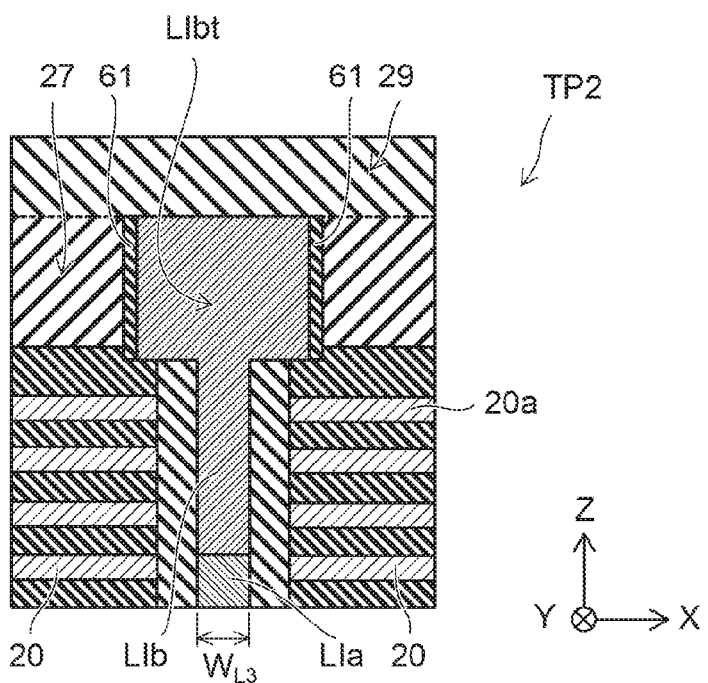

FIGS. 10A and 10B are schematic cross-sectional views showing a semiconductor memory device 5 according to a third embodiment. FIG. 10B is a schematic cross-sectional view showing region TP2 shown in FIG. 10A.

The semiconductor memory device 5 shown in FIG. 10A includes the source contact body LI including the first portion LIa and the second portion LIb. The first portion LIa is positioned between the source layer 10 and the second portion Lib, and is electrically connected to the source layer 10. The first portion LIa includes, for example, polysilicon; and the second portion LIb includes a metal. In the example as well, the warp of the wafer is suppressed by forming the first portion LIa using polysilicon; and the increase of the electrical resistance of the source contact body LI may be reduced by using a metal in the second portion LIb.

FIG. 10B schematically shows the structure of an upper end LIbt of the second portion LIb. The second portion LIb is formed to divide the insulating layer 27. As shown in FIG. 10B, an insulating layer 61 is provided between the insulating layer 27 and the upper end LIbt of the second portion LIb. The insulating layer 61 has a high dielectric constant and is provided to be, for example, more resistant to prescribed etching conditions than the insulating layer 27. The insulating layer 61 suppresses the spreading in the X-direction of the upper end LIbt of the second portion Lib, and thus, lowering the insulation breakdown voltage may be avoided between the second portion Lib and the contact plug Cb and between the second portion and the electrode layer 20a which is the uppermost layer of the multiple electrode layers 20.

For example, the upper end LIbt of the second portion LIb is provided above the electrode layer 20a of the uppermost layer to have a desired width $W_{L2}$ in the X-direction. For example, in the case where the spacing of the adjacent stacked bodies 100 becomes narrow and a width $W_{L3}$ in the X-direction of the source contact body LI provided between the adjacent stacked bodies 100 is 100 nanometers (nm) or less, the resistance of the source contact body LI increases markedly due to a so-called fine wire effect of the resistivity. To relax the increase of the resistance of the source contact body LI and reduce the electrical resistance of the source contact body LI, it is desirable to set the width $W_{L2}$ of the upper end LIbt of the second portion LIb to be wider than the width $W_{L3}$ of the source contact body LI between the adjacent stacked bodies 100.

A method for manufacturing the semiconductor memory device 5 will now be described with reference to FIGS. 11A to 11F. FIGS. 11A to 11F are schematic cross-sectional views showing the manufacturing processes of the semiconductor memory device 5. FIGS. 11B to 11D are schematic cross-sectional views showing region TP3 shown in FIG. 11A.

Figure 11A:
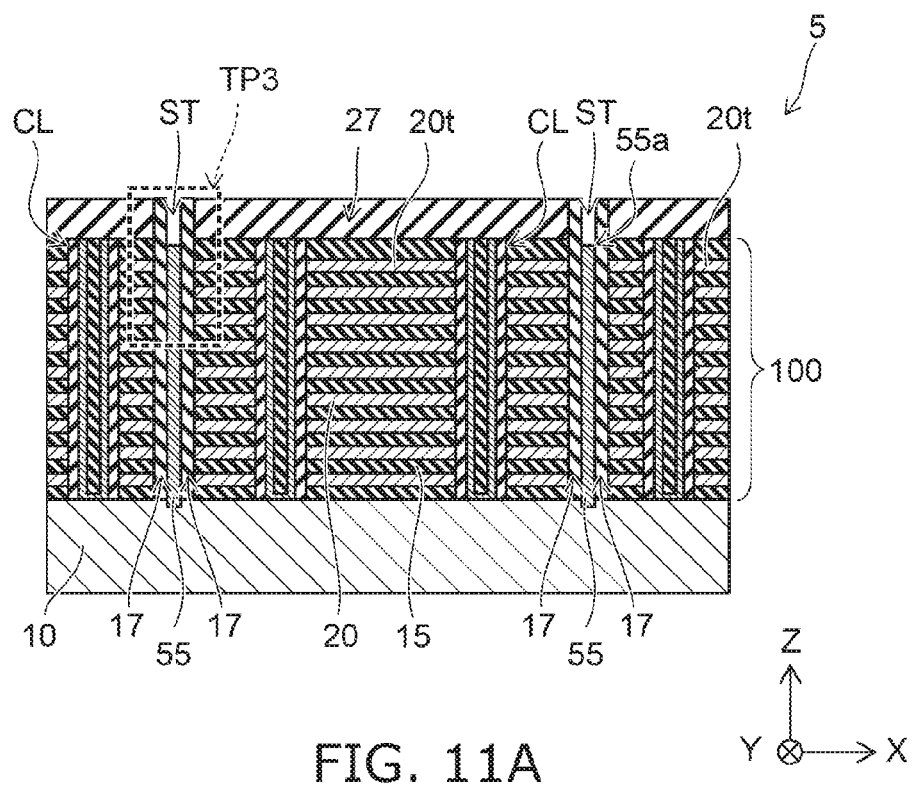
FIGS. 11A to 11F are schematic cross-sectional views showing a manufacturing process of the semiconductor memory device according to the third embodiment.
Figure 11B:
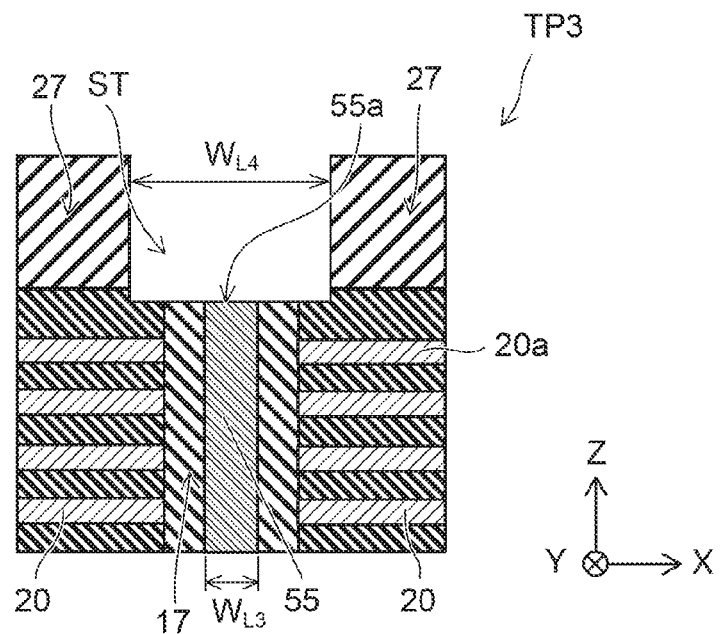
Figure 11C:
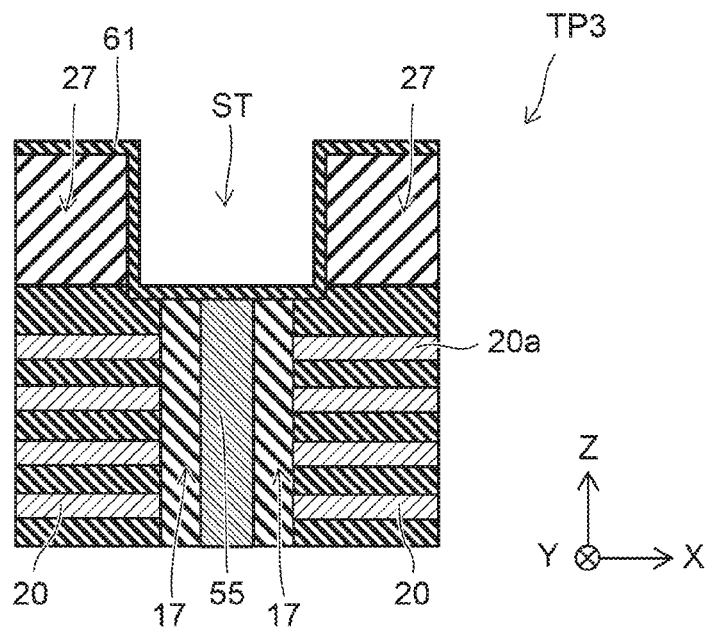
Figure 11D:
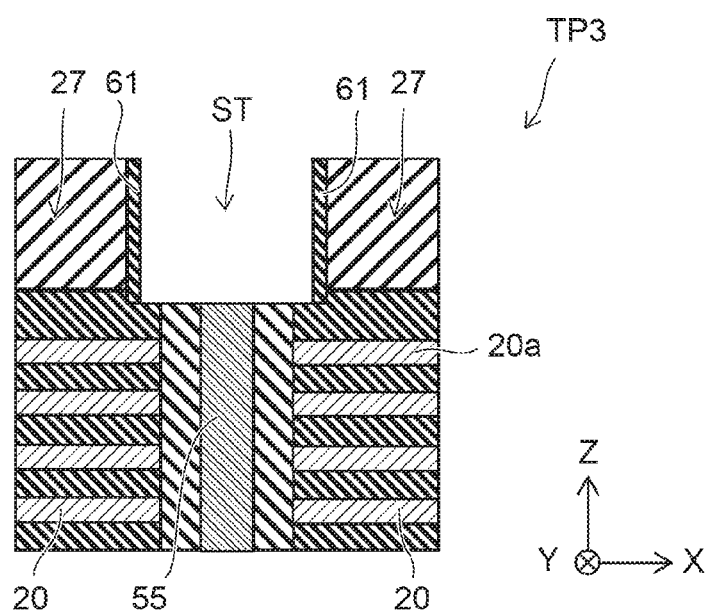

For example, FIG. 11A follows FIG. 8A, and shows the manufacturing process. However, in the example, it is unnecessary to cause the third portion 23d of the insulating layer 23 to remain between the insulating layer 17 and the insulating layer 27. As shown in FIG. 11A, etch-back of the conductive layer 55 is implemented to remove the portion filled in the upper portion of the slit ST.

As shown in FIG. 11B, an upper end 55a of the conductive layer 55 is positioned at a level higher than the electrode layer 20a of the uppermost layer. For example, a width $W_{L4}$ in the X-direction of the slit ST is extended by partially removing the insulating layer 27 using isotropic dry etching. In other words, a width $W_{L5}$ of the slit ST becomes wider than the width $W_{L3}$ in the X-direction of the conductive layer 55.

As shown in FIG. 11C, the insulating layer 61 is formed to cover the inner surface of the slit ST and the upper surface of the insulating layer 27. The insulating layer 61 has a dielectric constant that is higher than that of the insulating layer 27. The insulating layer 61 is, for example, an aluminum oxide layer or a silicon nitride layer. Also, the insulating layer 61 may be an insulating layer including a so-called High-k material.

As shown in FIG. 11D, the insulating layer 61 is selectively removed, leaving the portion covering the wall surface of the slit ST. For example, the insulating layer 61 that covers the inner wall of the slit ST may be formed by selectively removing the insulating layer 61 deposited on the bottom surface of the slit ST and the upper surface of the insulating layer 27 using anisotropic RIE.

Figure 11E:
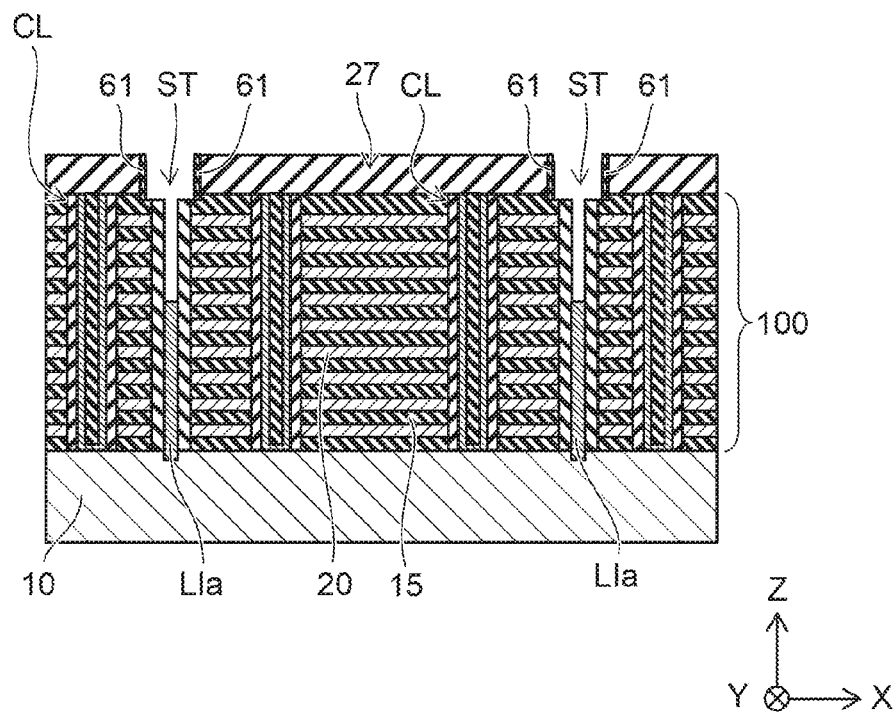

As shown in FIG. 11E, etch-back of the conductive layer 55 is further implemented to form the first portion LIa of the source contact body LI in the slit ST. In this process, the insulating layer 61 suppresses the etching of the insulating layer 27 and suppresses the spreading of the upper end of the slit ST in the X-direction and the −X direction.

Figure 11F:
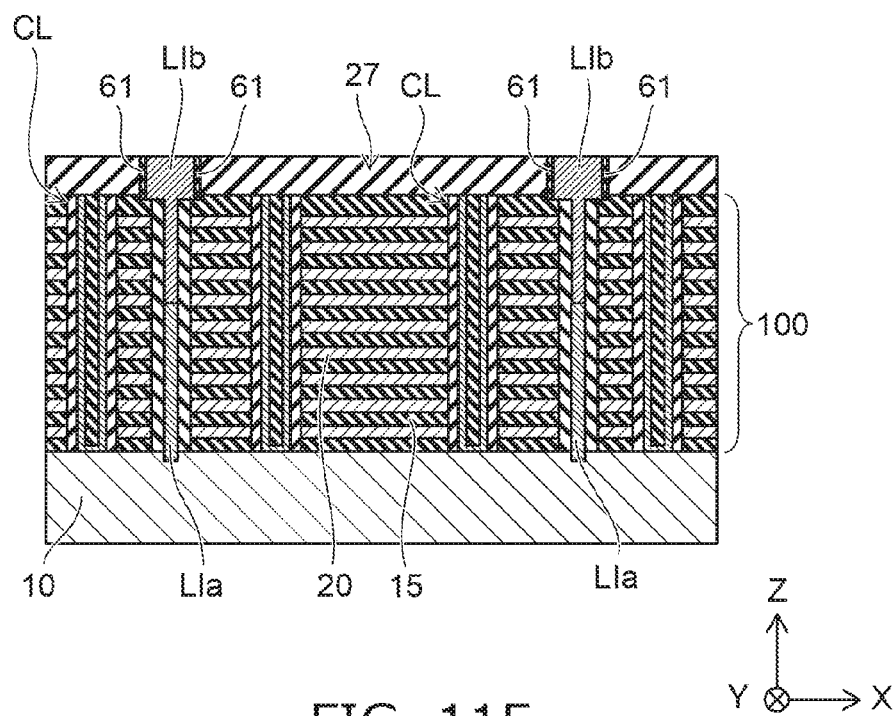

As shown in FIG. 11F, the second portion LIb of the source contact body LI is formed in the interior of the slit ST. For example, the second portion LIb has a structure in which barrier metal (TiN) and high-melting-point metal such as tungsten, etc., are stacked in order using CVD. Then, the source line SL, the insulating layers 27 and 29, and the bit lines BL are formed on the insulating layer 27; and the semiconductor memory device 5 is completed (see FIG. 10A).

Figure 12A:
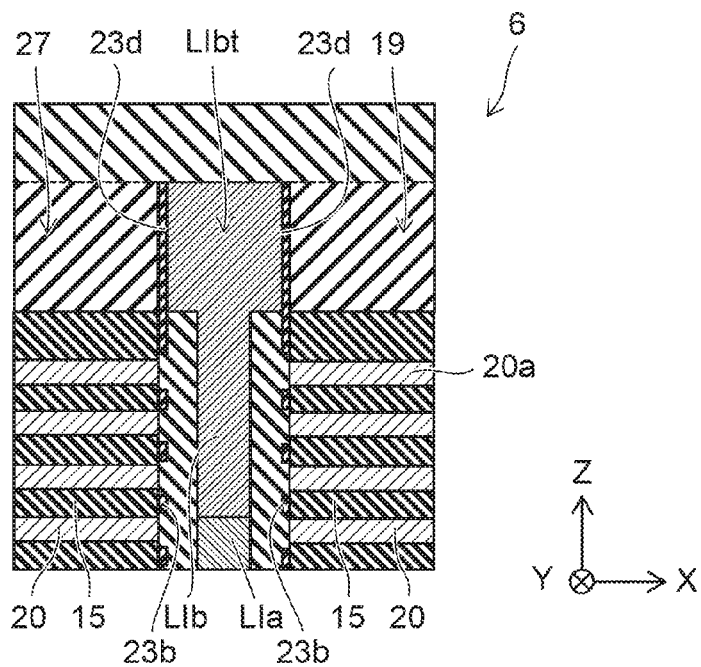
FIGS. 12A and 12B are schematic cross-sectional views showing a semiconductor memory device according to a variation of the third embodiment.
Figure 12B:
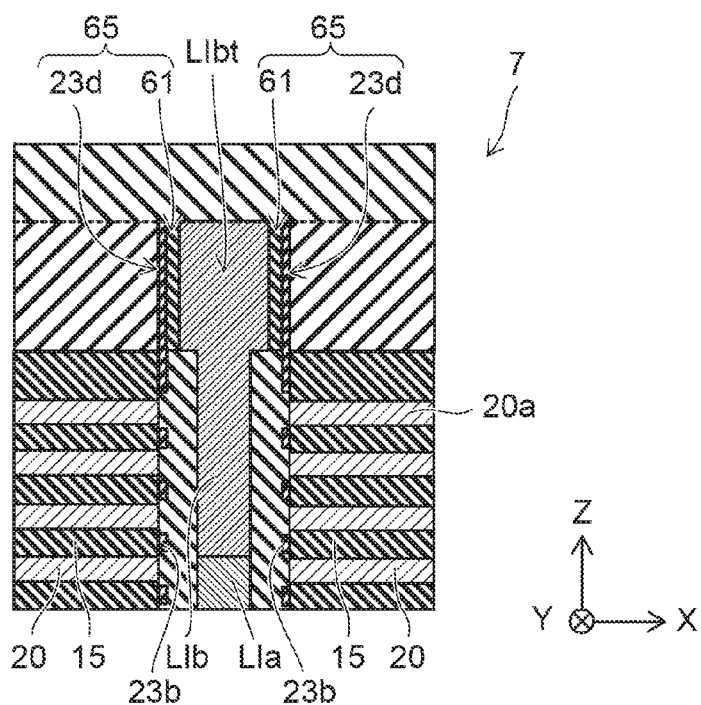

FIGS. 12A and 12B are schematic cross-sectional views showing semiconductor memory devices 6 and 7 according to a variation of the third embodiment. FIGS. 12A and 12B are schematic cross-sectional views showing a portion corresponding to region TP2 shown in FIG. 10A.

As shown in FIG. 12A, the third portion 23d of the insulating layer 23 may be interposed between the insulating layer 27 and the upper end LIbt of the second portion LIb of the source contact body LI. In the processes shown in FIGS. 4A to 4D, the third portion 23d of the insulating layer 23 remains on the end surfaces of each of the insulating layer 27 and the uppermost layer of the multiple insulating layers 15.

For example, when the third portion 23d of the insulating layer 23 remains between the insulating layer 17 and the insulating layer 27, the third portion 23d of the insulating layer 23 suppresses the spreading of the slit ST in the X-direction and the −X direction (see FIG. 8B).

In the example, the position of the upper end 55a of the conductive layer 55 is adjusted to be positioned at a prescribed level higher than the electrode layer 20a of the uppermost layer in the process shown in FIG. 11A. Thereby, the insulation breakdown voltage may be increased between the electrode layer 20a and the upper end LIbt.

Further, the insulating layer 61 may be formed after exposing the insulating layer 23d by partially removing the insulating layer 17. Thereby, an insulating layer 65 is formed between the insulating layer 27 and the upper end LIbt of the second portion LIb as shown in FIG. 12B. The insulating layer 65 includes the insulating layer 23d and the insulating layer 61.

In the example shown in FIG. 12B, the thickness in the X-direction of the insulating layer 65 including the high dielectric constant material becomes thicker than the thickness in the X-direction of the insulating layer 23d or the insulating layer 61. Thereby, the etching resistance of the insulating layer 65 may be improved in the process of the etch-back of the conductive layer 55 shown in FIG. 8E.

Thus, while the semiconductor memory devices 1 to 7 are described with reference to FIGS. 1 to 12B, the embodiments are not limited thereto. For example, the semiconductor layer 30 is not limited to polysilicon and may be a semiconductor layer including monocrystalline silicon, silicon germanium (SiGe), silicon carbide (SiC), germanium, or carbon.

The insulating layer 33 is not limited to an ONO structure and may include a High-k material such as $HfO_x$, $Al_2O_3$, $TaO_x$, etc., between the silicon nitride layer and the electrode layers 20. Also, a floating gate that includes silicon or a metal may be disposed between the semiconductor layer 30 and the electrode layers 20 in the memory cells MC.

Further, the insulating layer 33 may include, for example, at least one oxide such as $Y_2O_3$, $La_2O_3$, $Gd_2O_3$, $Ce_2O_3$, $CeO_2$, $ZrO_2$, $TiO_2$, HfSiO, HfAlO, ZrSiO, ZrAlO, AlSiO, or the like.

The insulating layer 33 may include an oxide expressed by the chemical formula of $AB_2O_4$. Here, A and B are one of Al, Sc, Ti, V, Cr, Mn, Fe, Co, Ni, Cu, Zn, Ga, or Ge. A and B may be the same element or may be different elements. For example, $Fe_3O_4$, $FeAl_2O_4$, $Mn_{1+x}Al_{2-x}O_{4+y}$, $Co_{1+x}Al_{2-x}O_{4+y}$, $MnO_x$, etc., may be used.

The insulating layer 33 may include an oxide expressed by the chemical formula of $ABO_3$. Here, A and B are one of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Te, Ru, Rh, Pd, Ag, Cd, In, or Sn. A and B may be the same element or may be different elements. For example, $LaAlO_3$, $SrHfO_3$, $SrZrO_3$, $StTiO_3$, etc., can be used.

The insulating layer 33 may include, for example, at least one oxynitride such as SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON, or the like. Also, the insulating layer 33 may include one of the oxynitrides in which a part of the oxygen included in the oxide recited above is replaced with nitrogen.

In the case where the insulating layer 33 has a multilayered structure, it is favorable for each of the insulating layers to be selected from the group consisting of $SiO_2$, SiN, $Si_3N_4$, $Al_2O_3$, SiON, $Ta_2O_5$, $TaO_2$, and $SrTiO_3$. For example, in an insulating layer including silicon such as $SiO_2$, SiN, SiON, etc., the oxygen atomic concentration and the nitrogen atomic concentration each are included to be not less than $1 \times 10^{18}$ atoms/cm$^3$; and the barrier heights are mutually different. Also, these insulating layers include a material including impurity atoms forming a defect state, or dots (quantum dots) of a semiconductor or a metal between these insulating layers.

The electrode layers 20, the bit lines BL, and the source line SL may include, for example, WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $CrSi_x$, $MnSi_x$, $FeSi_x$, etc.

The electrode layer 20 is, for example, a simple metallic element or a mixture of multiple metallic elements. Also, the electrode layer 20 may include, for example, a silicide, an oxide, or a nitride. The electrode layer 20 may include, for example, Pt, Au, Ag, TiAlN, SrRuO, Ru, RuN, Ir, Ti, V, Cr, Mn, Fe, Co, Ni, Cu, TiN, TaN, LaNiO, Al, $PtIrO_x$, $PtRhO_x$, Rh, TaAlN, $SiTiO_x$, $WSi_x$, $TaSi_x$, $PdSi_x$, $PtSi_x$, $IrSi_x$, $ErSi_x$, $YSi_x$, $HfSi_x$, $NiSi_x$, $CoSi_x$, $TiSi_x$, $VSi_x$, $CrSi_x$, $MnSi_x$, $FeSi_x$, etc. The electrode layer 20 may include a portion that functions as a bonding layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a first stacked body provided on a conductive layer;
   a second stacked body disposed side by side with the first stacked body on the conductive layer; and
   a conductive body provided between the first stacked body and the second stacked body and electrically connected to the conductive layer,
   the first stacked body and the second stacked body each including:
      a plurality of electrode layers stacked on the conductive layer,
      a first insulating layer provided between adjacent electrode layers of the plurality of electrode layers,
      a second insulating layer including a first portion and a second portion, the first portion being provided between the first insulating layer and one of the adjacent electrode layers, the second portion being separated from the first portion and provided on an end surface of the first insulating layer facing the conductive body, the second insulating layer having a dielectric constant higher than a dielectric constant of the first insulating layer,
      a semiconductor layer extending through the plurality of electrode layers and the first insulating layer in a stacking direction of the plurality of electrode layers, and
      a charge storage part provided between the semiconductor layer and at least one electrode layer of the plurality of electrode layers.

2. The semiconductor memory device according to claim 1, further comprising:
   a third insulating layer provided between the conductor body and the plurality of electrode layers and provided between the first insulating layer and the conductive body, the third insulating layer having a dielectric constant smaller than the dielectric constant of the second insulating layer,
   the third insulating layer including a portion separating the second portion of the second insulating layer from the first portion of the second insulating layer.

3. The semiconductor memory device according to claim 2, wherein the third insulating layer includes the same material as the first insulating layer.

4. The semiconductor memory device according to claim 1, further comprising:
a plurality of first insulating layers provided between the plurality of electrode layers respectively, wherein
the plurality of electrode layers each includes a metal positioned between adjacent first insulating layers of the plurality of first insulating layers, and a barrier metal positioned between the metal and the first portion of the second insulating layer.

5. The semiconductor memory device according to claim 4, wherein the metal positioned between the adjacent first insulating layers is a high-melting-point metal.

6. The semiconductor memory device according to claim 1, wherein the adjacent electrode layers have an etching rate larger than an etching rate of the second insulating layer for a prescribed etchant.

7. The semiconductor memory device according to claim 1, wherein the second insulating layer includes a High-k material.

8. The semiconductor memory device according to claim 1, wherein the first portion of the second insulating layer is separated from the second portion at a corner where the end surface contacts a surface of the first insulating film facing the electrode layer.

9. The semiconductor memory device according to claim 1, further comprising:
a fourth insulating layer provided on the first stacked body and the second stacked body and separated by the conductive body,
the fourth insulating layer having a dielectric constant smaller than the dielectric constant of the second insulating layer, and
the second insulating layer further including a third portion positioned between the fourth insulating layer and the conductive body.

10. The semiconductor memory device according to claim 1, further comprising:
a fourth insulating layer provided on the first stacked body and the second stacked body and separated by the conductive body; and
a fifth insulating layer positioned between the fourth insulating layer and the conductive body, the fifth insulating layer having a dielectric constant higher than a dielectric constant of the fourth insulating layer.

11. The semiconductor memory device according to claim 10, wherein the fifth insulating layer includes the same material as the second insulating layer.

12. The semiconductor memory device according to claim 1, wherein
the conductive body includes a first portion and a second portion, the first portion including conductive polysilicon, and the second portion including a metal; and
the first portion is positioned between the conductive layer and the second portion.

13. A semiconductor memory device, comprising:
a first stacked body provided on a conductive layer;
a second stacked body disposed side by side with the first stacked body on the conductive layer;
a conductive body provided between the first stacked body and the second stacked body and electrically connected to the conductive layer; and
a first insulating layer provided on the first stacked body and the second stacked body and separated by an end portion of the conductive body,
the first stacked body and the second stacked body each including:
a plurality of electrode layers stacked on the conductive layer,
a semiconductor layer extending through the plurality of electrode layers in a first direction, the first direction being a stacking direction of the plurality of electrode layers, and
a charge storage part provided between the semiconductor layer and at least one electrode layer of the plurality of electrode layers,
the end portion of the conductive body having a width in a second direction wider than a width in the second direction of a portion of the conductive body positioned between the first stacked body and the second stacked body, the second direction being a direction from the first stacked body toward the second stacked body.

14. The semiconductor memory device according to claim 13, further comprising:
a second insulating layer positioned between the first insulating layer and the end portion of the conductive body, the second insulating layer having a dielectric constant higher than a dielectric constant of the first insulating layer.

15. The semiconductor memory device according to claim 13, wherein
the conductive body includes a first portion and a second portion, the first portion including conductive polysilicon, and the second portion including a metal;
the first portion is positioned between the conductive layer and the second portion; and
the second portion includes the end portion.

* * * * *